(12) United States Patent
Zink et al.

(10) Patent No.: US 7,957,948 B2
(45) Date of Patent: Jun. 7, 2011

(54) SYSTEM AND METHOD FOR CAPACITY PLANNING FOR SYSTEMS WITH MULTITHREADED MULTICORE MULTIPROCESSOR RESOURCES

(75) Inventors: Kenneth C. Zink, Austin, TX (US); Douglas M. Neuse, Austin, TX (US); Christopher B. Walton, Austin, TX (US)

(73) Assignee: Hyperformit, Inc., Austin, TX (US)

( * ) Notice: Subject to any disclaimer, the term of this patent is extended or adjusted under 35 U.S.C. 154(b) by 797 days.

(21) Appl. No.: 11/895,176

(22) Filed: Aug. 22, 2007

(65) Prior Publication Data

US 2009/0055823 A1 Feb. 26, 2009

(51) Int. Cl.
*G06F 11/30* (2006.01)
*G06F 9/44* (2006.01)
*G06F 9/45* (2006.01)
*G06F 7/60* (2006.01)
*G06F 17/40* (2006.01)
*G06F 11/00* (2006.01)
*G06G 7/58* (2006.01)

(52) U.S. Cl. ............... 703/13; 703/2; 703/22; 702/176; 702/179; 702/186; 702/187; 702/188; 710/18; 717/103

(58) Field of Classification Search .............. 703/13, 703/2, 22, 32; 702/176, 179, 186, 187, 188; 710/18; 717/103
See application file for complete search history.

(56) References Cited

U.S. PATENT DOCUMENTS

| | | |
|---|---|---|
| 5,446,885 A | 8/1995 | Moore et al. |
| 5,560,014 A | 9/1996 | Imamura |
| 5,581,760 A | 12/1996 | Atkinson et al. |
| 5,630,127 A | 5/1997 | Moore et al. |
| 5,710,926 A | 1/1998 | Maurer |
| 5,819,007 A | 10/1998 | Elghazzawi |
| 5,875,285 A | 2/1999 | Chang |
| 5,900,870 A | 5/1999 | Malone et al. |
| 5,946,661 A | 8/1999 | Rothschild et al. |
| 5,987,453 A | 11/1999 | Krishna et al. |
| 6,061,675 A | 5/2000 | Wical |
| 6,144,893 A | 11/2000 | Van Der Vegt et al. |
| 6,167,405 A | 12/2000 | Rosensteel, Jr. et al. |
| 6,182,279 B1 | 1/2001 | Buxton |
| 6,195,665 B1 | 2/2001 | Jarett |

(Continued)

OTHER PUBLICATIONS

Jogalekar et al. "Evaluating the Scalability of Distributed Systems", IEEE Transactions on Parallel and Distributed Systems, vol. 11, No. 6, Jun. 2000.*

(Continued)

*Primary Examiner* — Kamini S Shah
*Assistant Examiner* — Shambhavi Patel
(74) *Attorney, Agent, or Firm* — Schultz & Associates, P.C.

(57) ABSTRACT

A method for expressing a hierarchy of scalabilities in complex systems, including a discrete event simulation and an analytic model, for analysis and prediction of the performance of multi-chip, multi-core, multi-threaded computer processors is provided. Further provided is a capacity planning tool for migrating data center systems from a source configuration which may include source systems with multi-threaded, multicore, multichip central processing units to a destination configuration which may include destination systems with multithreaded, multicore and multichip central processing units, wherein the destination systems may be different than the source systems. Apparatus and methods are taught for the assembling of and utilization of linear and exponential scalability factors in the capacity planning tool when a plurality of active processor threads populate processors with multiple chips, multiple cores per chip and multiple threads per core.

12 Claims, 18 Drawing Sheets

U.S. PATENT DOCUMENTS

| | | |
|---|---|---|
| 6,195,794 B1 | 2/2001 | Buxton |
| 6,256,649 B1 | 7/2001 | Mackinlay et al. |
| 6,397,252 B1 * | 5/2002 | Sadiq ............................ 709/226 |
| 6,446,063 B1 | 9/2002 | Chen et al. |
| 6,470,464 B2 * | 10/2002 | Bertram et al. .................. 714/37 |
| 6,507,835 B1 | 1/2003 | Amundsen et al. |
| 6,529,901 B1 | 3/2003 | Chaudhuri et al. |
| 6,546,394 B1 | 4/2003 | Chong et al. |
| 6,553,371 B2 | 4/2003 | Gutierrez-Rivas |
| 6,564,113 B1 | 5/2003 | Barto et al. |
| 6,564,204 B1 | 5/2003 | Amundsen et al. |
| 6,604,084 B1 | 8/2003 | Powers et al. |
| 6,615,182 B1 | 9/2003 | Powers et al. |
| 6,615,206 B1 | 9/2003 | Jakobsson et al. |
| 6,618,852 B1 | 9/2003 | van Eikeren et al. |
| 6,643,660 B1 | 11/2003 | Miller et al. |
| 6,694,507 B2 | 2/2004 | Arnold et al. |
| 6,697,799 B1 | 2/2004 | Neal et al. |
| 6,721,754 B1 | 4/2004 | Hurst et al. |
| 6,745,390 B1 | 6/2004 | Reynolds et al. |
| 6,757,579 B1 | 6/2004 | Pasadyn |
| 6,792,393 B1 * | 9/2004 | Farel et al. ..................... 702/186 |
| 7,010,465 B2 * | 3/2006 | Butt et al. ...................... 702/186 |
| 7,035,771 B2 * | 4/2006 | Butt et al. ...................... 702/186 |
| 7,373,557 B1 * | 5/2008 | Wise et al. ....................... 714/47 |
| 7,546,222 B2 * | 6/2009 | Chintalapti et al. ........... 702/186 |
| 2001/0044759 A1 | 11/2001 | Kutsumi et al. |
| 2002/0078131 A1 | 6/2002 | Dowd et al. |
| 2002/0103777 A1 * | 8/2002 | Zhang .............................. 706/59 |
| 2002/0129348 A1 | 9/2002 | Kerpan et al. |
| 2002/0169735 A1 | 11/2002 | Kil et al. |
| 2002/0198984 A1 | 12/2002 | Goldstein et al. |
| 2003/0018490 A1 | 1/2003 | Magers et al. |
| 2003/0030637 A1 | 2/2003 | Grinstein et al. |
| 2003/0040887 A1 * | 2/2003 | Shupps et al. ................. 702/187 |
| 2003/0079160 A1 * | 4/2003 | McGee et al. ................... 714/39 |
| 2003/0088643 A1 | 5/2003 | Shupps et al. |
| 2003/0105768 A1 | 6/2003 | Berkowitz et al. |
| 2003/0110007 A1 * | 6/2003 | McGee et al. ................ 702/179 |
| 2003/0120372 A1 | 6/2003 | Ruth et al. |
| 2003/0172054 A1 | 9/2003 | Berkowitz et al. |
| 2003/0182307 A1 | 9/2003 | Chen et al. |
| 2003/0204348 A1 | 10/2003 | Suzuki et al. |
| 2003/0212643 A1 | 11/2003 | Steele et al. |
| 2003/0212701 A1 | 11/2003 | Beavin et al. |
| 2003/0229641 A1 | 12/2003 | Kamath et al. |
| 2003/0236585 A1 | 12/2003 | Kao et al. |
| 2004/0044985 A1 | 3/2004 | Kompalli et al. |
| 2004/0059740 A1 | 3/2004 | Hanakawa et al. |
| 2004/0068340 A1 | 4/2004 | Mayberry |
| 2004/0093107 A1 | 5/2004 | Good et al. |
| 2004/0098706 A1 | 5/2004 | Khan et al. |
| 2004/0103108 A1 | 5/2004 | Andreev et al. |
| 2004/0117050 A1 | 6/2004 | Oskin et al. |
| 2004/0133595 A1 | 7/2004 | Black |
| 2004/0148587 A1 | 7/2004 | Conrad et al. |
| 2004/0148589 A1 | 7/2004 | Conrad et al. |
| 2004/0153187 A1 | 8/2004 | Knight et al. |
| 2004/0153189 A1 | 8/2004 | Emerson et al. |
| 2004/0160341 A1 | 8/2004 | Feyereisen et al. |
| 2005/0216235 A1 * | 9/2005 | Butt et al. ..................... 702/186 |
| 2005/0289505 A1 * | 12/2005 | Williams ...................... 717/103 |
| 2006/0161399 A1 * | 7/2006 | Butt et al. ..................... 702/186 |
| 2006/0224375 A1 * | 10/2006 | Barnett et al. .................. 703/22 |
| 2007/0219646 A1 * | 9/2007 | Oslake et al. ................... 700/32 |
| 2008/0071939 A1 * | 3/2008 | Tanaka et al. ................... 710/18 |

OTHER PUBLICATIONS

Brataas et al. "Exploring Architecutral Scalability", 2004.*
Ruggiero et al. "Scalability Analysis of Evolving SoC Interconnect Protocols", 2004.*
Amit et al. "Scalability of Multimedia Applications on Next Generation Processors", IEEE, 2006.*
Balakrishnan et al. "The Impact of Performance Asymmetry in Emerging MultiCore Architectures", Proceedings of the $32^{nd}$ International Symposium on Computer Architecutre, IEEE 2005.*
Beltran et al. "Evaluating the Scalability of Java Event-Driven Web Servers", 2004.*
Brataas, et al. "Exploring Architectural Scalability", ACM 2004.*
Frolund et al. "Design-Time Simulation of Large-Scale Distributed Object System", Hewlett-Packard Company, 1998.*
Wojcik et al. "Quad Core Performance and Scalability Measured Using Oracle I/O", Mar. 2007.*

* cited by examiner

Prior art - background

Prior art - background
data center configurations

Prior art - background – Server node

| system | OS | processor chip type | processor clock speed | number chips | cores/chip | threads/core | measured throughput S_meas | measured throughput rate, R_meas |
|---|---|---|---|---|---|---|---|---|
| | | | | | | | | |
| | | | | | | | | |
| | | | | | | | | |
| | | | | | | | | |
| | | | | | | | | |

Columns: 131, 132, 133, 134, 135, 136, 137, 138, 139

Rows (130): record 1, record 2, ..., record z

FIGURE 5

Pseudocode for simulated CPU task handler within discrete event simulation

Given a system server configuration with:

330 {
- nchips = number of processor chips in system
- ncpc = number of cores per processor chip in system
- ncores = nchips * ncpc = total number of cores in system
- ntpc = number of threads per core
- nthreads = ncores * ntpc = total number of available threads in system 332 {
- linear scalability factors = $[L_1, L_2, L_3, L_4]$,
- exponential scalability factors = $[\alpha_1, \alpha_2, \alpha_3, \alpha_4]$.

Variables:

333 {
- ntasks = current number of tasks requesting CPU service dispatched to system
- (* ntasks <= nthreads *)
- ith = index to active tasks running from 1 to ntasks
- Service_Demand(task_ID) = CPU time requested.
- ServiceDemandRemaining(i) = requested CPU time remaining to be processed for task i
- DTC(ith) = deliverable_thread_capacity to ith task.
- CurrentTime = current time of simulation clock 334 {
```
START:
Until finished with discrete event simulation
    Wait for "task dispatch event" (* new task CPU request or task CPU completion *);
    HandleDispatchEvent()
End until;
END:
```

Figure 8A

335 — 
```
"task dispatch event": HandleDispatchEvent ()
{
  if dispatch of new task
        inc(ntasks);
        ServiceDemandRemaining(ntasks) = ServiceDemand(new task);
  else if completion of task j
        for ith from j+1 to ntasks
              ServiceDemandRemaining(ith-1)=ServiceDemandRemaining(ith);
        Next ith;
        dec(ntasks);
        Delta_time = time elapsed since last allocation event;
        For ith from 1 to ntasks
              ServiceDemandCompleted = DTC(ith) * Delta_time
              ServiceDemandRemaining(ith) =
                       ServiceDemandRemaining(ith) - ServiceDemandCompleted;
        Next ith;
  End if-else
  DispatchAndCalculateExpectedTimesOfCompletion (ntasks);
}
```

337 —
```
DispatchAndCalculateExpectedTimesOfCompletion (ntasks)
{
  for ith from 0 to (ntasks – 1)
        ichip = modulo(ith, nchips);
        icore = modulo(((ith-ichip)/ nchips), ncpc);
        DTC(ith) = DeliveredThreadCapacity(ntasks, ichip, icore);
        ExpectedTimeOfCompletion(ith) = CurrentTime +
                       ( ServiceDemandRemaining(ith) / DTC(ith) );
  Next ith;
}
```

338 —

$$DeliveredThreadCapacity(nthreads, ichip, icore) =$$
$$(OS\_EffectiveNelements(icore, ichip, nthreads) / nthreads)$$
$$* \frac{Chip\_EffectiveNelements(icore, ichip, nthreads)}{ChipsContending(ichip, icore, nthreads)}$$
$$* \frac{Core\_EffectiveNelements(icore, ichip, nthreads)}{CoresContending(ichip, icore, nthreads)}$$
$$* \frac{Thread\_EffectiveNelements(icore, ichip, nthreads)}{ThreadsContending(ichip, icore, nthreads)};$$

Figure 8B

336 $\Bigg\{$ $ThreadsContending(ichip, icore, nthreads) =$
$$Ceiling\left[\frac{Max[0, nthreads - icore * nchips - ichip]}{ncores}\right];$$

$CoresContending(ichip, icore, nthreads) =$
$$\sum_{jcore=0}^{ncpc-1} Min[ThreadsContending(ichip, jcore, nthreads), 1],$$

$ChipsContending(ichip, icore, nthreads) =$
$$\sum_{jchip=0}^{nchips-1} Min[CoresContending(jchip, icore, nthreads), 1];$$

339 $\Bigg\{$ $OS\_EffectiveNelements(icore, ichip, nthreads) =$
$$([1 + L_1 * (nthreads - 1)] * \alpha_1 {}^{\wedge}(nthreads - 1)),$$

$Chip\_EffectiveNelements(icore, ichip, nthreads) =$
$$[1 + L_2 * (ChipsContending(icore, ichip, nthreads) - 1))$$
$$*\alpha_2 {}^{\wedge}(ChipsContending(icore, ichip, nthreads) - 1),$$

$Core\_EffectiveNelements(icore, ichip, nthreads) =$
$$[1 + L_3 * (CoresContending(icore, ichip, nthreads) - 1))$$
$$*\alpha_3 {}^{\wedge}(CoresContending(icore, ichip, nthreads) - 1),$$

$Thread\_EffectiveNelements(icore, ichip, nthreads) =$
$$[1 + L_4 * (ThreadsContending(icore, ichip, nthreads) - 1))$$
$$*\alpha_4 {}^{\wedge}(ThreadsContending(icore, ichip, nthreads) - 1),$$

Figure 8C

Pseudocode for service rate vectors, μ(i), calculation.

450 — Given a system server configuration with:

nchips = number of processor chips in system server
ncpc = number of cores per processor chip in system server
ncores = nchips * ncpc
ntpc = number of threads per core in system server
max_threads = ntpc*ncores = total number of usable threads 451 — linear scalability factors = $[L_1, L_2, L_3, L_4]$,
exponential scalability factors = $[\alpha_1, \alpha_2, \alpha_3, \alpha_4]$.

452 — Variables:
i = index counting the number of tasks dispatched to server
icore = index counting the cores
ichip = index counting the chips 454 — The service rate vectors $\mu(i)$ are calculated for i =1 to max_threads, $$\mu(i) = \sum_{ichip=0}^{nchips-1} \sum_{icore=0}^{ncpc-1} DeliveredCapacity(ichip, icore, i),$$

wherein

455 —
$DeliveredCapacity(ichip, icore, nthreads) = ThreadsContending(ichip, icore, nthreads)$
$* (OS\_EffectiveNelements(nthreads) / nthreads)$ $* \dfrac{Chip\_EffectiveNelements(icore, ichip, nthreads)}{ChipsContending(ichip, icore, nthreads)}$ $* \dfrac{Core\_EffectiveNelements(icore, ichip, nthreads)}{CoresContending(ichip, icore, nthreads)}$ $* \dfrac{Thread\_EffectiveNelements(icore, ichip, nthreads)}{ThreadsContending(ichip, icore, nthreads)};$

Figure 10

Pseudo-code to estimate service time from measured utilization.

440 — Compute service times $S_w$ such that the computed utilization $U_w$ is within U_tolerance of measured utilization $U^0_w$ for each workload w.
Inputs:

| | |
|---|---|
| $\mu(i)$ | Service rate at thread population i, = number of active threads |
| g | Number of service rates = maximum number of active threads for given system |
| $U^0_w$ | Measured utilization by workload w |
| $U^0_0$ | Measured utilization summed over all workloads |
| $\lambda_w$ | Arrival rate of workload w transactions |
| Max_Iterations | The maximum number of iterations to perform |
| U_Tolerance | The required relative closeness between measured and computed service times |

442 — Compute the minimum and maximum possible efficiency:

$E\_Max = 1$
$E\_Min = $ minimum of $[\mu(i) / i]$ over i=1, g

444 — Estimate the initial efficiency E and service times $S_w$ $E = U^0_0 * E\_Min + (1 - U^0_0) * 1$
For each workload w
    $S_w = E * g * U^0_w / \lambda_w$ 446 — Iterate:

```
For j = 1 To Max_Iterations
    Compute traffic intensity ρ and utilization U₀ using standard queuing theory and
        latest estimate of service times S_w
    Close = True
    If (ρ >= 1) or Absolute_Value(U₀ – U⁰₀) > U_Tolerance Then
        Close = False
        Adjust service times for device d as described below
    End If
    If Close then Exit For
    If I = Max_Iterations then Error (failed to converge within Max_Iterations)
Next j
Now proceed with standard queuing analysis using the computed service times
```

448 — To adjust service times:

```
If (ρ >= 1) or (U₀ > U⁰₀) Then
    E_Max = E
    E = (E_Min + E) / 2
Else
    E_Min = E
    E = (E_Max + E) / 2
End If
'Recompute service times
For each workload w
    S_w = E * g * U⁰_w / λ_w
```

Figure 11

SYSTEM AND METHOD FOR CAPACITY PLANNING FOR SYSTEMS WITH MULTITHREADED MULTICORE MULTIPROCESSOR RESOURCES

COPYRIGHT NOTICE

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD OF INVENTION

The present invention relates generally to computer server capacity planning and enterprise application performance engineering within the field of information technology and more specifically describes a useful set of tools by which data center managers can reliably estimate and compare performance of server and workload migration scenarios wherein the servers operate multithreaded processes on a plurality of processor cores.

BACKGROUND OF THE INVENTION

The performance of large scale production environments is an area of considerable interest as businesses become more diverse and applications become more complex. Data systems must remain reliable and available. Reliability and performance can be a considerable issue in the face of rapid system or application scaling such as would be experienced in a merger of two large corporations or in the implementation of a new server intensive application such as a web media application involving streaming video. Furthermore, system architecture is rapidly expanding to take advantage of CPU architectures having multiple cores with each core containing multiple processor threads capable of executing multiple program tasks.

A goal of modern capacity planners and application performance engineers is to optimize business applications on very large and complex systems with perhaps thousands of server nodes that are often geographically dispersed. The workloads processed by these applications and the infrastructure in which they execute change over time. New and different users and user behaviors change the level and mix of the workloads. The servers, networks and their configurations change for a variety of business reasons. Capacity planners and performance engineers must determine a) the impact of such anticipated or hypothetical changes, b) when anticipated increases in workload levels will exceed the capacity of the existing infrastructure, and c) what solutions to predicted performance bottlenecks will be most effective. Capacity planners and performance engineers accomplish these goals by measuring the current performance of their business applications, load-testing their applications in a test lab, or estimating such measurements during application design, and then building performance models using those measurements, and using those models to predict how performance will change in response to anticipated or hypothetical changes to the workloads, applications and infrastructure.

Server consolidation is one type of change to the IT infrastructure that occurs with increasing frequency in order to simplify server management, reduce space and power requirements, and other reasons—including simplification and potential improvement of performance management. However, the number of server consolidation options in a modern large IT environment is enormous. IT managers and capacity planners cannot effectively choose among the myriad of server consolidation options by trial and error or rules of thumb. They need the ability to evaluate different server consolidation scenarios rapidly and easily in order to make good choices before implementing those choices. Furthermore, with the advent of new processor configurations such as multicore multithreaded processors, choice of processor configuration becomes important to data center configuration. The present invention facilitates evaluation of server consolidation scenarios—and more generally of all scenarios specifying changes to workloads, applications or infrastructure—by modeling the scalability of the processor configurations of the servers involved in those scenarios.

In some situations, low performance of a production system may be analyzed. To relieve the situation, a workload reassignment or new equipment may be needed. In the absence of adequate modeling facilities the planning and implementation of the nature of the equipment to be deployed or the workload reassignment requires assembling an expensive test environment and scaling analysis.

In the situation of interest in the present invention, processor architectures utilizing a plurality of CPU chips, with a plurality of cores per chip and multithreading may be deployed to replace older slower equipment. In this case the IT capacity manager is required to plan a detailed server consolidation where the workload of a number of servers is consolidated onto a smaller number of servers. In the prior art, investigation of this type of system consolidation is also carried out with a test environment.

Referring to FIG. 1, a modern large-scale computer network known as a production environment is depicted. In a production environment, a data center 1 serves as a central repository for distributed applications and data access to other networks. The data center includes a business application server cluster 2, a database server cluster 3 and a web application server cluster 4. The business application server cluster, data server cluster and web application server are interconnected and provide responses to requests for information from external sources such as shown at 11 and 12. Requests for information can come from company intranets such as shown at 5 which support other computer networks. In this example, a single company internet can support an operations network 8, a marketing department network 7 and an execution and financial network 6. Requests for information are derived from applications running on the various networks which generate workloads. Data center 1 in this example also services requests and provides responses through the internet 6 to retail customers 10 and other corporate customers 9.

This invention facilitates the evaluation of the performance effects of all anticipated changes to workloads, applications and infrastructure. Some particularly complex changes that have been difficult to analyze prior to this invention are data center server migration, server consolidation and workload reassignment. A general data center server migration situation is shown in FIG. 2A in which a source or base data center configuration 20 is to be changed to a destination data center configuration 30. A set of Z workloads 18 defined as $\{w\}=w_1, w_2, \ldots w_Z$ are arriving at source data center configuration 20 at base arrival rates $AB(\{w\})$ 15 during a base time interval. Workloads 18 are requests for specific computer instructions to be processed by the base data center. For example, the workloads may be generated by a number of internet users simultaneously utilizing their web browsers to view and interact with web content from a particular company's web servers such as viewing catalogs of merchandise, investigating online specifications, placing orders or providing online payments. A destination data center configuration 30 is prescribed to accept workloads 18 at a set of arrival rates A({w}) 16 where A({w}) 16 is scaled from base arrival rates AB({w}) by some scaling factor G({w}), where G(w)=1 represents the processing of the workloads by the destination data center configuration at the base (original) workload arrival rates.

Source data center configuration 20 comprises a set of N server clusters 25-1, 25-2, . . . 25-N. Furthermore, server cluster 25-1 comprises a set of server nodes 28-1 and similarly, server clusters 25-1, . . . 25-N contain sets of server nodes 28-2, . . . 28-N (not shown). Server clusters 25-1, . . . 25-N functionally operates to service workloads 18 at arrival rates AB({w}) 15. The dimension of a server cluster is defined as the number of server nodes in the cluster. Source parameters 22 describe configuration parameters of the source data center configuration 20.

Destination data center configuration 30 comprises a set of M server clusters 35-1, 35-2, . . . 35-M. Server cluster 35-1 comprises a set of server nodes 38-1 and similarly, server clusters 35-2, . . . 35-M contain sets of server nodes 38-2, . . . 38-M (not shown). Server clusters 35-1, . . . 35-M functionally operates to service workloads 18 at arrival rates A({w}) 16. Note that the destination data center configuration 30 may contain a subset of the base server clusters 25-1 . . . 25-M. Furthermore, note that N or M may equal 1 (one) and that the dimension of a given server cluster may equal 1 (one) so that either the source data center configuration 20 or destination data center configuration 30 may contain only one server node. Destination parameters 32 describe the source data center configuration 30.

FIG. 2B shows a server node 50 typical of the server nodes in the source data center configuration 20 or of destination data center configuration 30. Server node 50 comprises a set of processor chips 55 arranged on an appropriate electronics hardware platform (not shown) for executing computational and I/O instructions. The hardware platform accommodates on-board dynamic random-access memory 70 accessible by processor chips 55 for dynamic data storage. Attached to processor chips 55 and contained in server node 50 are a set of disk drives 60 for persistent storage of data and typically comprised of magnetic read-write hard drives. Also attached to processor chips 55 and contained within server node 50 are a set of network interface cards NICs 65 which provide a means by which the processor chips 55 attach to networks.

In migrating from source data center configuration 20 to destination data center configuration 30, a potentially large number of configuration parameters 22 and 32 must be specified or computed. Source parameters 22 are measured and specified typically as a baseline. Additionally, workloads 18 may be grown on a number of time intervals so that the performance sensitivity of the destination data center configuration 30 to workload may be plotted as a function of time In server consolidation, the workloads from selected source server clusters 25-1, . . . 25-N are fully reassigned and distributed to the destination server clusters 35-1, . . . 35-M. The present invention applies generally to situations whereby the IT manager desires to understand what the performance of the destination data center configuration 30 will be relative to the source data center configuration 20 so as to optimize the destination data center configuration 30 for performance, cost, upgradeability or other feature. The preferred embodiment of the present invention provides the ability to evaluate the performance of multichip, multicore, multithread processor configurations—and the effect of their performance on the performance of the applications and workloads—involved in server consolidation, workload reassignment and all other changes to a data center's workloads, applications and infrastructure.

In the case of multicore, multithread processing units, more sophisticated capacity planning and performance engineering tools are needed. Analysis tools in the state of the art may take multiple CPUs into account, but do not take into account non-linear scalability effects when resources such as cache memory and disks are shared by multiple cores and multiple threads.

In FIG. 3, the set of processor chips 55 is shown wherein each CPU chip may contain a plurality of microprocessor cores 80, a microprocessor core having for example its own floating point unit and its own instruction pipeline. Within microprocessor cores 80, it is possible to fork the instruction pipeline into multiple logical processor threads 85, wherein each processor thread (thread) may be activated to execute program instructions for different programs or may be activated to execute parallel processing instructions for a single program.

Program instructions assigned to and being executed on a processor thread is referred to as a task; the terminology "active thread" means a processor thread with a task currently assigned and executing When processor threads 85 are activated the operating system will typically allocate tasks to processor threads most efficiently by minimizing the number of active threads per processor chip 55 and minimizing the number of active threads per core 85 so that on-chip resources are less likely to be shared. In planning for capacity upgrades, scalability becomes dynamic wherein active thread population varies with workload as tasks are allocated and deallocated in rapid succession. As active thread population varies in a dynamic way, CPU performance and system throughput will also vary in a dynamic way.

A performance tool is needed to take into account the variability of CPU performance in the presence of multicore multithreaded CPU architectures. The capacity planner for an enterprise system is faced with hardware upgrades which leverage these new highly parallel processing architectures, but complicate the allocation of workloads across the enterprise system. Furthermore, OS system designers require performance information that will allow the OS system designer to avoid inefficient thread dispatch algorithms. CPU architects require performance models of real systems in working environments so that processor chip architectures will combine resources optimally for threads and cores.

The present invention teaches a novel method for analyzing a multicore, multichip, multithreaded system architecture for the purposes of producing capacity planning in multichip, multicore, and multithread environments.

The present invention teaches a novel method for analyzing a multicore, multichip, multithreaded system architecture for the purposes of producing capacity planning in multichip, multicore, and multithread environments. While CPU performance data is beginning to be compiled for this class of systems (e.g. SPECint_rate2006 from Standard Performance Evaluation Corporation), apparatus and methods do not currently exist in the art to reduce this data to a usable form in capacity planning analysis and teach the utilization of such data. The complications of the problem capacity planning problem incorporating new system architectures are threefold:

1. It has been historically observed that the performance of computers with several single-core, single-thread chips does not scale linearly. Analysis of the performance of recent multi-core and multi-thread processor chips indicate that they do not scale linearly in these dimensions as well.

2. The performance scalability of computer systems is also affected by the efficiency of the operating system to schedule the use of the processor resources. A particular system may perform differently with the same applications run with different operating systems.

3. The observed response time of requests for CPU processing on multi-thread processor cores typically increases in discrete steps—not in a smooth curve—with increasing load. For example, a typical hyper-threaded processor core may exhibit a throughput capacity of "1" with a single active thread and a throughput capacity of "1.2" (20% increase) with two active threads on that core. If the response time of a CPU request was one second when that request is executed when it is the only active thread on a core that response time will increase to 1.67 seconds if there are two threads active on that core.

Briefly, the reason the performance of these systems do not scale linearly is due to contention for hardware resources. In older, single-core systems that contention was usually most noticeable at memory—multiple processing cores trying to access the same bank of physical memory which had long access times compared to the processor speed. In later systems the scalability was improved with the introduction of high-speed cache memory but shared cache could still limit scalability as well as access to memory on cache misses.

The scalability of multiple processor chips and multiple cores per chip in contemporary systems is still dominated by memory access. Although these systems may have three or more levels of cache the second or third level (L2 or L3 cache) may be shared by multiple processor chips or multiple cores on a chip. Even with the introduction of multiple levels or cache, memory access continues to be a performance issue because processor speeds (clock rates) have increased by orders of magnitude while memory access speeds have increased by factors in single or double digits.

Multiple hardware threads executing in a processor core share the instruction execution logic of that core. Each program instruction is executed in a series of steps or "stages" in the processor logic; e.g., instruction decode, data fetch, branch prediction, logic operation (add, subtract, Boolean, etc.) and data store. This series of stages is known as the processor execution "pipeline." As an instruction of a program passes through a stage of the pipeline the next instruction of that program can advance to that stage of the pipeline.

Since an instruction does not typically utilize all of the capability of any one stage (an arithmetic operation won't utilize branch prediction logic and a Boolean operation won't utilize floating point arithmetic logic), with the addition of an additional set of instruction data and control registers an second independent "thread" of execution can make use of idle logic at any stage in the pipeline. (The second thread must be an independent instruction stream because of data dependencies within any single instruction stream.) The primary contention between multiple hardware threads in a core is access to the required logic at each stage in the pipeline although some contention for memory access still exists. The contention for "stage logic" can be mitigated by replication of some logic at critical stages (e.g., duplication of Boolean and integer logic in the "operation stage") to make the use of more than two hardware threads at a core a viable architectural alternative.

The problem addressed by the present invention is to devise a consistent, parameterized algorithm that can be used to model the performance and response time across a broad range of these types of contemporary and future processors and operating systems.

SUMMARY OF INVENTION

The present invention teaches apparatus and methods to assemble CPU performance data into a scalability model and then to use the scalability model to predict system performance for multithreaded, multicore and multichip processor based systems.

In one embodiment of the present invention a method is taught whereby CPU performance data is efficiently gathered into an internal CPU performance repository where the internal data is analyzed by the characteristics of operating system, chip architecture type, number of chips, number of cores per chip and number of supported threads per core to determine a set of scalability factors. Scalability factors are defined for linear and exponential scaling of the characteristics with numbers of elements per characteristic.

The scalability factors, once determined are used in another embodiment of the present invention to analyze system performance for a source data center system and a destination data center system for the purposes of capacity planning. A first embodiment of the analysis process teaches the assemblage and utilization of a discrete event simulation model in which the novel multithreaded, multicore, multichip scalability factors are implemented to enable capacity planning using discrete event simulation of applications and workloads due to applications.

A second embodiment of the analysis process teaches the employment of scalability factors for multithreaded, multicore and multichip system architectures in a queuing theory based analytical method for the purposes of capacity planning. More specifically, methods are taught wherein service times for the system workloads are estimated and service rate vectors for processor configurations with various CPU request loads are determined and applied to a capacity planning tool.

In embodiments of the discrete event simulator and analytical methods for capacity determination of CPU architectures based on scalability factors an efficient method of dispatch is taught.

In an alternative embodiment of the present invention, efficiency of dispatch processes in operating systems for different CPU architectures operating in different system level and data center configurations may be determined.

In another alternative embodiment, different CPU architectures may be compared in the CPU design process for various system level and data center configurations.

BRIEF DESCRIPTION OF DRAWINGS

The disclosed inventions will be described with reference to the accompanying drawings, which show important sample embodiments of the invention and which are incorporated in the specification hereof by reference, wherein:

FIG. 5 is a block diagram of the internal performance data repository in the preferred embodiment of the present invention.

FIGS. 8A, 8B and 8C are a pseudo code listing of a simulated CPU task handler within the discrete event simulator of the preferred embodiment of FIG. 7.

FIG. 10 is a pseudo code listing of the method for determining service rate vectors within the preferred embodiment of FIG. 9.

FIG. 11 is a pseudo code listing of a preferred embodiment for estimating service times within the second embodiment analysis process of the present invention.

DETAILED DESCRIPTION OF PREFERRED EMBODIMENTS

The numerous innovative teachings of the present invention will be described with particular reference to the presently preferred embodiment (by way of example, and not of limitation).

While the present invention has been described in terms of specific embodiments thereof, it will be understood in view of the present disclosure, that numerous variations upon the invention are now enabled to those skilled in the art, which variations yet reside within the scope of the present teaching. Accordingly, the invention is to be broadly construed, and limited only by the scope and spirit of the claims now appended hereto.

Figure 1:
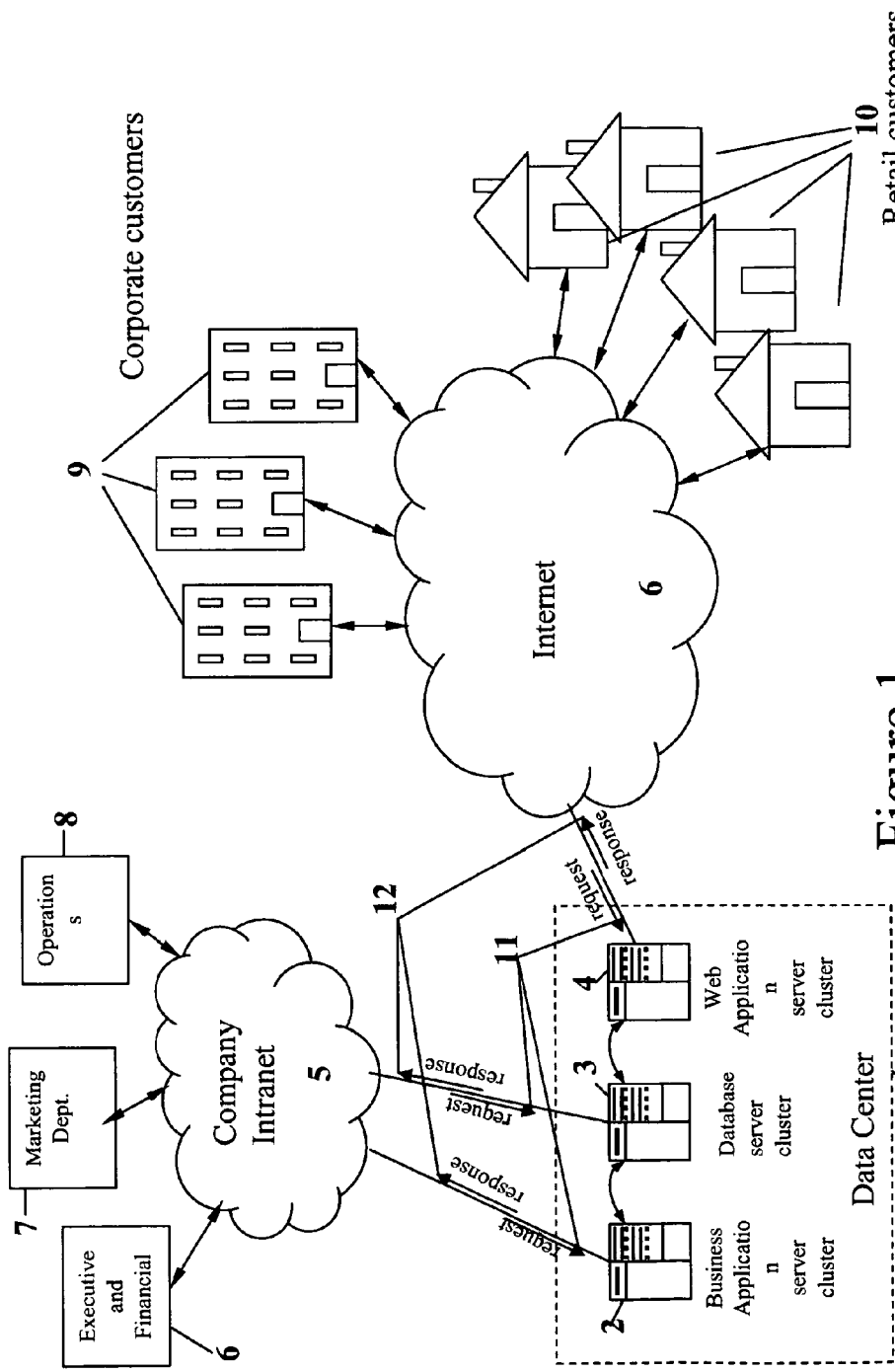
FIG. 1 is a prior art diagram of a data center and applications service network.
Figure 2A:
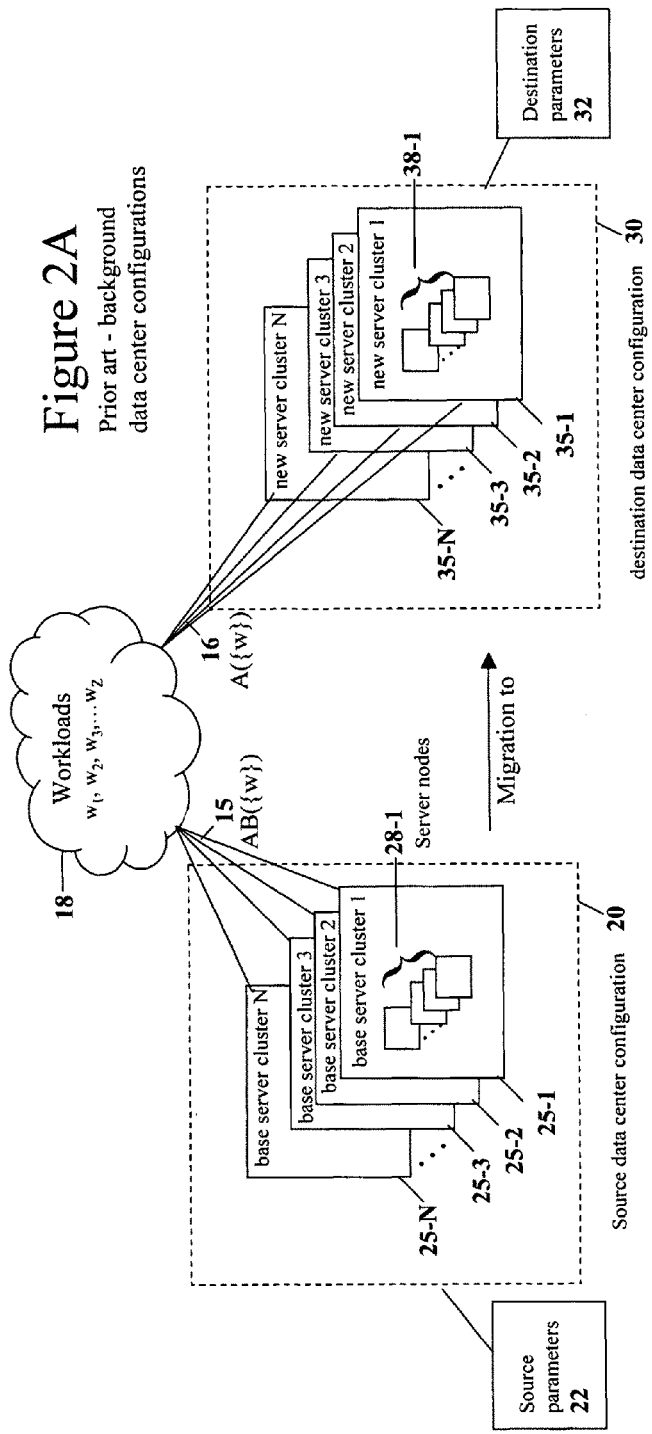
FIG. 2A is a block diagram depicting a server migration from a source data center to a destination data center.
Figure 2B:
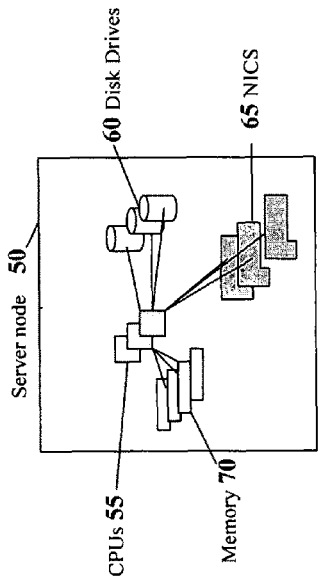
FIG. 2B is a block diagram showing the components of a server node within a data center configuration.
Figure 3:
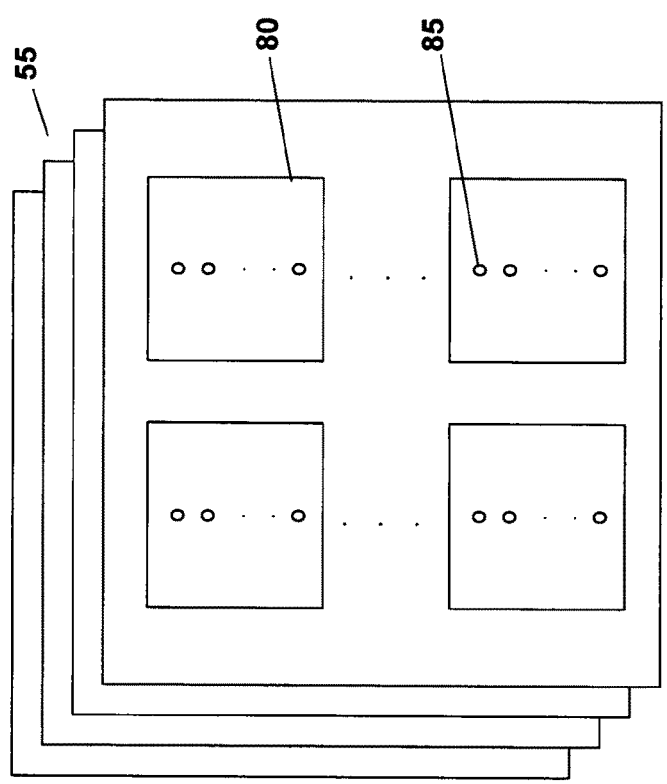
FIG. 3 is a block diagram showing CPU architecture incorporating multiple chips, multiple cores and multiple threads per core
Figure 4:
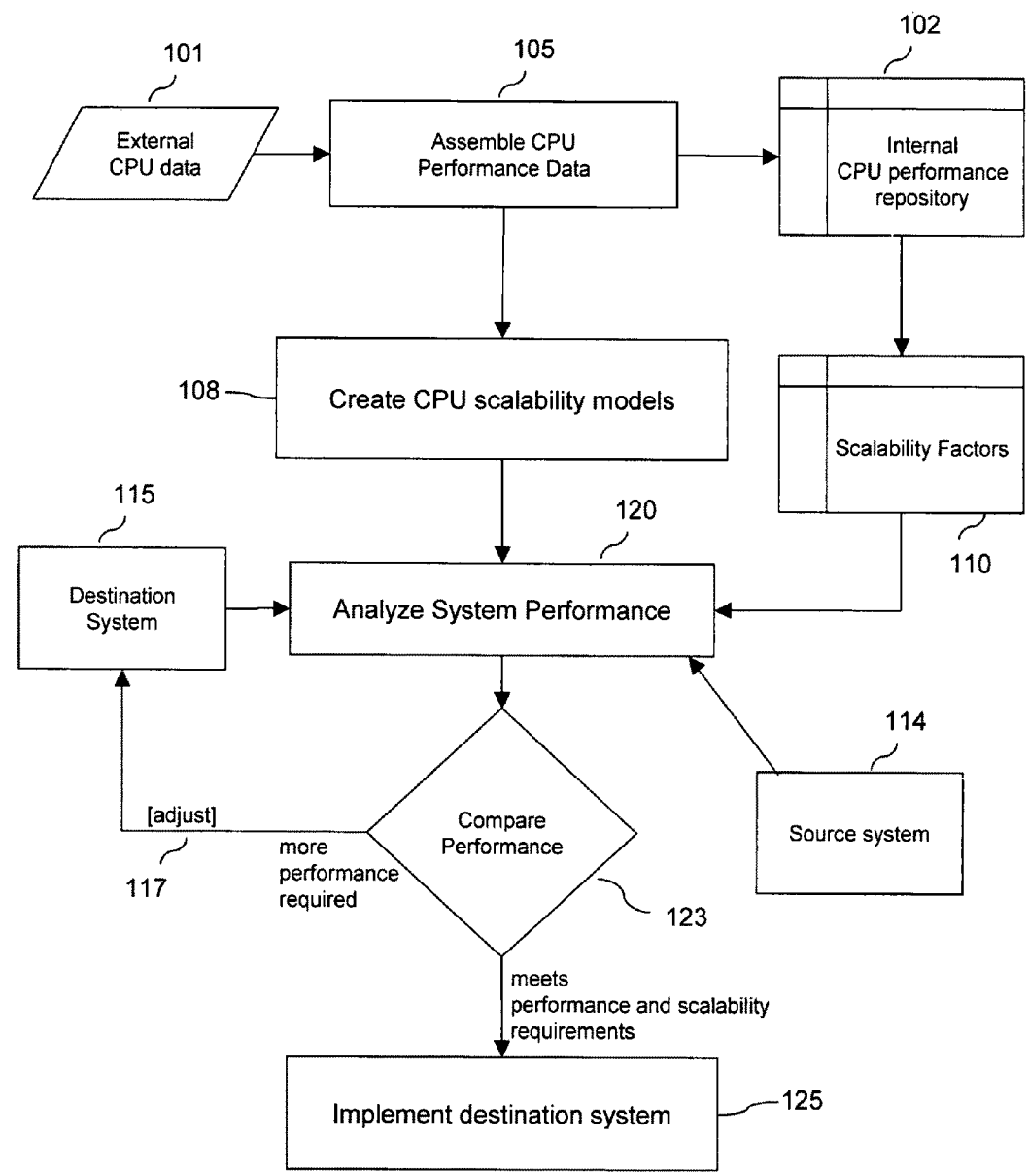
FIG. 4 is a flowchart depicting the operation of a capacity planning tool that utilizes scalability factors for CPUs with multiple chips, multiple cores and multiple threads per core.

FIG. 4 shows the capacity planning system 100 for planning a system migration from a source system configuration 114 to a destination system configuration 115. The source system configuration 114 may be similar to the source data center configuration 20 of FIG. 2A, having a set of base servers and a set of source parameters describing those base servers and wherein the base servers have nodes with CPUs, disk drives, memory and NICS similar to FIG. 2B. The destination system configuration 115 may be similar to the destination data center configuration 30 of FIG. 2A, having a set of new servers and a set of destination parameters describing the new servers and wherein the servers have nodes with CPUs, disk drives, memory and NICS different than those of the source system configuration. In the context of the present invention, the new servers in the destination system may have a plurality of processor chip 55 each having a plurality of microprocessor cores 80 and each microprocessor core 80 having a plurality of processor threads 85 capable of executing multiple program tasks according to FIG. 3. The base servers in the source system configuration may also have a plurality of processor chips with a plurality of microprocessor cores on each processor chip and the capacity to operate multiple processor threads per microprocessor core. The preferred embodiment of the present invention is focused on providing a means by which the performance of a destination system configuration 115 may be compared to a source system configuration 114 when the processor configurations are multi-thread, multi-core and multi-chip. For example, the source system configuration 114 may have servers with a plurality of processor chips, each processor chip having only a single-thread on a single core per processor chip, whereas the destination system configuration 115 may assume, for example, a quad-core dual threaded CPU architecture for a plurality of processor chips per server. The performance measurement to be compared is typically the resource utilization of the systems and the response time to the workloads presented to the systems.

Continuing with FIG. 4, the capacity planning system 100 obtains CPU performance data from external CPU data repositories 101 in data collection step 105. The CPU performance data is organized and stored by data collection step 105 into an internal CPU data repository 102. Those skilled in the art will appreciate that many of the functions of system 100 can be carried out in a software application running on a machine resident on the network or having access to the data required to complete the methods of the invention.

FIG. 5 shows CPU performance data in internal repository 102 in the preferred embodiment of the present invention. CPU performance data is tabulated into a set of records 130 wherein each record represents a system configuration containing at least a system description 131, an operating system type 132, processor chip type 133, processor clock speed 134, number of chips in the system 135, number of cores per chip 136, number of processor threads per core 137, a measured single thread performance S_meas 138 and at least one measured throughput performance rate R_meas 139. The measured performances 138 and 139 are preferably the SPECint2006 and the SPECint_rate2006 from Standard Performance Evaluation Corporation. In the preferred embodiment, data collection step 105 uses an automatic process to periodically scrape SPECint2006 and SPECint_rate2006 data from the SPEC web site. SPECint_rate2006 measures the CPU performance in cases where multiple CPUs, multiple cores and multiple threads are in use. Of course, this performance data may be obtained from other sources such as actual lab measurements or from systems manufacturers.

After the CPU performance data has been stored in internal repository 102, capacity planning system 100 analyzes the CPU performance data to create an eight parameter scalability fit in scalability modeling process 108. The eight scalability parameters are determined for each system of interest in the internal repository 102 and stored into persistent storage as scalability factors 110. In practice, the stored scalability factors 110 are stored as separate columns in the internal repository 102. The scalability factors determine a linear and an exponential fit to each of four system CPU characteristics, the four characteristics being the operating system (OS) scalability, chip scalability, core scalability and thread scalability. Table 1 shows the how the scalabilities are determined for a system.

TABLE 1

| Entity | Linear Scalability Factors | Exponential Scalability Factors | Scale factors |
|---|---|---|---|
| OS | L[1] | α[1] | N[1] = total number of active threads servicing CPU requests in the system |
| Chip (CPU) | L[2] | α[2] | N[2] = number of CPU chips having active threads |
| Core | L[3] | α[3] | N[3] = number of cores/chip having active threads |
| Thread | L[4] | α[4] | N[4] = number of active threads/core utilized |

$$\text{EffectiveNElements}[i] = (1 + L[i] \times (N[i] - 1)) \times \alpha^{(N[i]-1)}$$
$$\text{Scalability}[i] = \text{EffectiveNElements}[i]/N[i]$$

$$\text{System\_Scalability} = \prod_i \text{Scalability}[i]$$

"EffectiveNElements" is the effective number of scalable processing elements and "Scalability" is the efficiency of the processor configuration on a scale from 0 to 1, the $L[i]$ are linear scalability factors and $\alpha[i]$ are exponential scalability factors where $0 < L[i] \leq 1$ and $0 < \alpha[i] \leq 1$; and $N[i]$ is the number of elements that are active so that $N[i]$ is always less than or equal to the total number of elements available in the system. For example, in determining core scalability for dual-core chips, $N[3] \leq 2$. In the case that any of $N[i]=1$, EffectiveNElements[i] and Scalability[i] reduce to 1 meaning that the efficiency in that case is equivalent to the performance of a task running on a single element in isolation and therefore experiencing no degradation due to contention between potentially competing CPU resources. The total scalability of the system, "System_Scalability", is the product of scalability[i] of the four characteristics for i=1.4 and is the amount of work in CPU-secs per second of real time. It is useful to define Deliverable_Thread_Computation=System_Scalable.

The equations of Table 1 are valid in the case of symmetric dispatch of CPU requests, wherein active threads are evenly distributed across processor chips. Otherwise the system efficiency must be calculated from the perspective of each active thread such that N[4] describes the number of competing threads in the same core.

The analysis process 120 uses these basic formula to analyze the source system configuration 114 and the destination system configuration 115 using either a discrete event simulation or a standard queuing theory analysis to predict system response times and component utilizations. Each of these types of analysis is available in capacity planning applications such as "Modeler™" and "Capacity Planner™", available from Hyperformix, Inc. of Austin, Tex. Analysis process 120 is described further in connection with FIG. 7.

The results of analysis process 120 are compared in system comparison step 123 to arrive at the level of improvement (or degradation) in system performance due to a potential migration from source system configuration 114 to destination system configuration 115 (or to some other potential change to the system such as a workload change or server upgrade). A criteria determined by the capacity planner is used to decide whether it is favorable to migrate to the destination system configuration 115. In cases, where migration is favored the destination system configuration is implemented in implementation step 125. In cases where migration is not favored, the capacity planner will typically adjust the destination system configuration 115 and perform analysis step 120 in an iterative manner 117 until the desired improvement or cost benefit is obtained. A typical criterion for favoring the implementation step 125 would be improvement in utilization by some given amount, for example a reduction in average CPU utilization from a source system 90% CPU utilization to a destination system 50% CPU utilization. Reduction in average response time for system software applications form reasonable criteria for capacity planning process 100. In the case of using a discrete event simulation, estimates for peak response times and peak utilizations are also possible.

Figure 6:
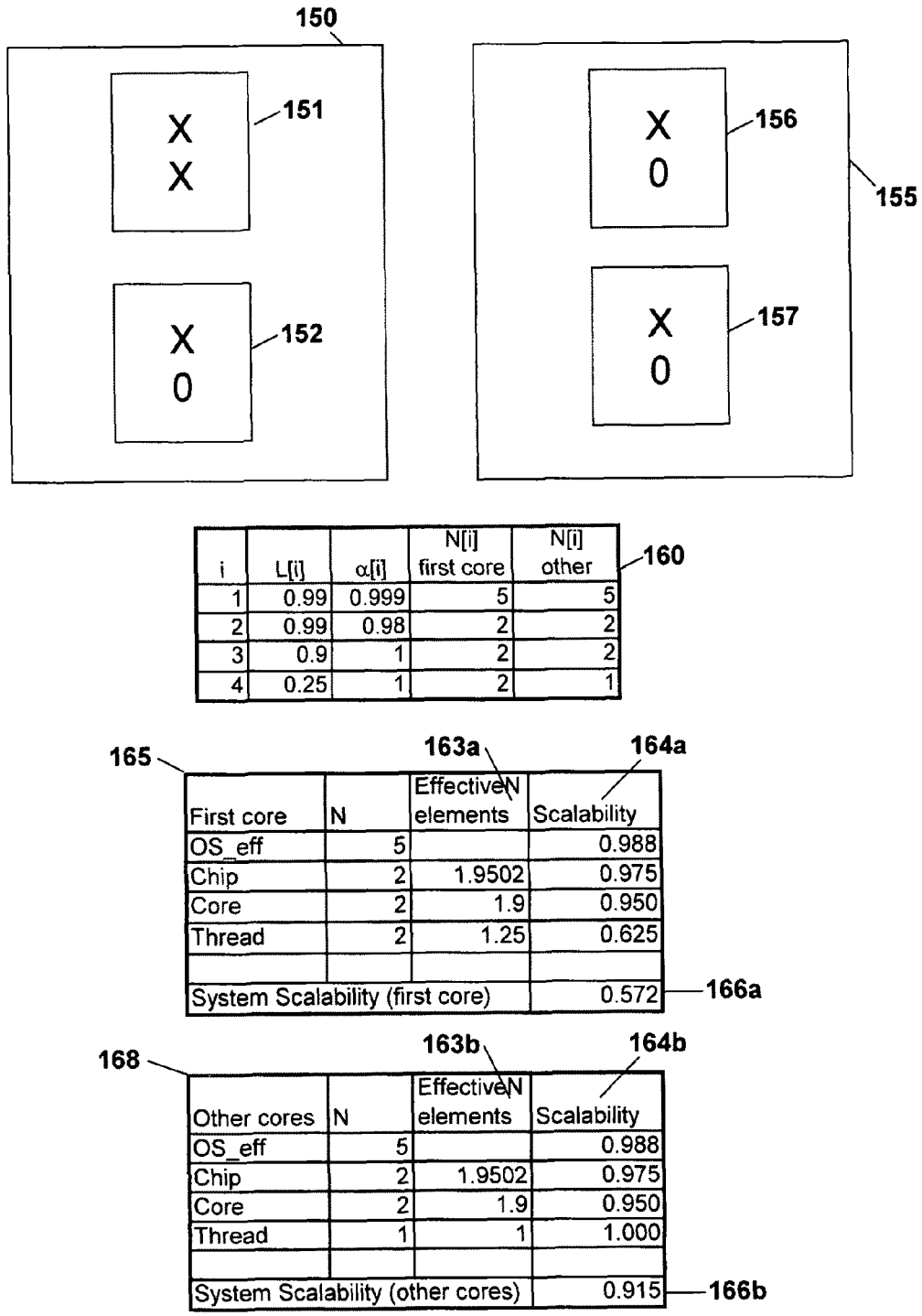
FIG. 6 is a block diagram of an example scalability analysis for a multithread, multicore, multichip processor.

FIG. 6 shows a diagrammatic example of how the component and system efficiencies are computed. The diagram shows a CPU architecture having a 2 processor chip, 2 cores per chip, and 2 threads per core with a specific processor type and a specific operating system ("OS"). Processor chip 150 has core 151 and core 152. Core 151 has two processor threads capable of operating two program tasks. Core 152 has two processor threads capable of operating two program tasks. Processor chip 155 has core 156 and core 157, core 156 having two processor threads capable of operating two program tasks and core 157 having two processor threads capable of operating two program tasks. An unused thread is designated by an "O" and an active thread is designated by an "X". In this example, five CPU requests have been dispatched and therefore five threads are actively servicing tasks. On processor chip 150, three threads are active: two threads on core 151 and one thread on core 152. On processor chip 155, two threads are active: one thread on core 156 and one thread on core 157. The given dispatch describes a non symmetric dispatch of CPU requests. The tasks running on cores 156 and 157 should generate a higher efficiency since there is lower contention for resources on chip 155. An exemplary table of scalability factors 160 has been arbitrarily chosen as an example. Typically, data such as the data in table 160 would be taken from scalability factors 110 for the specific processor type and OS. One might expect the scalability of such an architecture to be approximately the number of active threads (equal to 5 CPU-secs/second), that is the architecture delivers computing work at the same rate as if there were five independent processors.

Table 165 presents a typical scalability analysis for core 151. Table 168 presents a typical scalability analysis for cores 152, 156 and 157.

Table 160 is a list of linear scalability factors L[i] and a list of exponential scalability factors a[i] for i=1 . . . 4 for a set of elements, element[1]=OS, element[2]=chip, element[3]=core, element[4]=thread, for which N[1]=5, N[2]=2, N[3]=2 and where N[4]=2, respectively, for core 151 and N[4]=1 for cores 152, 156 and 157.

For the first core, core 151, EffectiveNElements [i] 163a, scalability [i] 164a, and system_scalablity 165a are calculated using equations from Table 1 for the data provided in table 160. Similarly for cores 152, 156 and 157, EffectiveNElements [i] 163b, scalability [i] 164b, and system_scalablity 166b are calculated as in Table 1.

To illustrate the calculation, the thread EffectiveNElements of core 151 is computed in table 165, column 163a, according to:

$E[4]=[(1+(0.25)\cdot(2-1)](1)^{(2-1)}=1.25$

And the thread scalability of core 151 is computed in table 165, column 164a, according to:

$$S[4]=E[4]/2=0.625$$

since there are 2 threads contending for resources at core 151. Similarly, the thread EffectiveNElements of cores 152, 156 and 157 are computed in table 168 column 163b according to $$E'[4]=(1+0.25(1-1))*1^{\wedge}(1-1)=1.0$$

and the thread scalability of cores 152, 156 and 157 are computed in table 168, column 164b according to $$S'[4]=E'[4]/1=1.0,$$

since there is only 1 thread per core on cores 152, 156 and 157. System scalability of core 151 is computed as:

$$(0.988)*(0.975)*(0.950)*(0.625)=0.572.$$

The results of similar computations for OS, chips and cores are shown in tables 165 and 168, table 165 for tasks on core 151 and table 168 for all other tasks. In table 165 the two active threads on core 151 are running at 57% efficiency due to contention between the chips, cores and threads. In table 168 the two active threads on cores 156 and 157 are running at 91.5% efficiency. The average efficiency across all five threads is a weighted average equal to 77.8% so that computing work is done at a rate of 5*0.778=3.88 CPU-secs/second. An analytic queuing model computes and uses the average efficiency as described below and a discrete-event simulation model simulates the efficiency experienced by each task individually, a more accurate approach.

Figure 7:
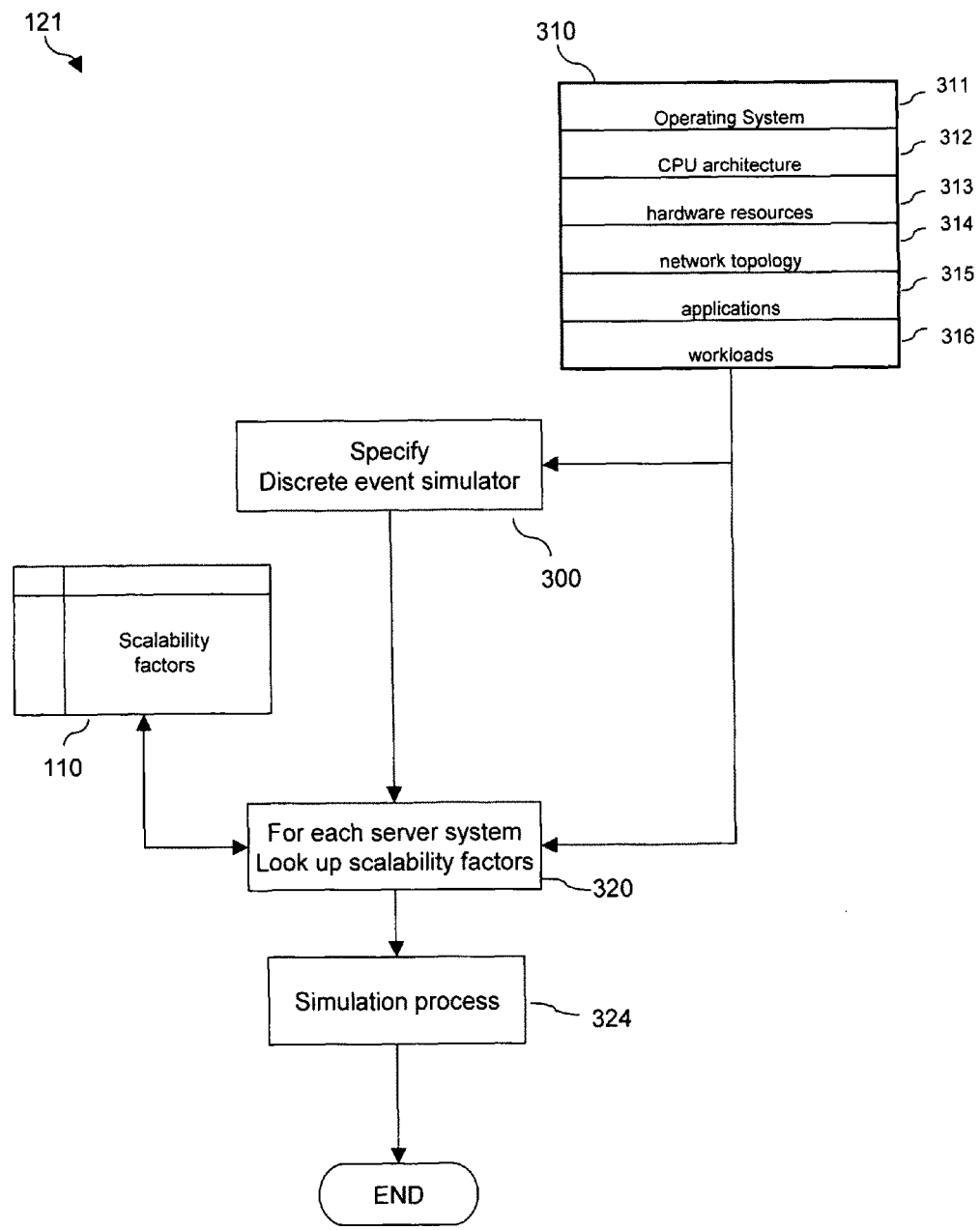
FIG. 7 is a flowchart depicting a preferred embodiment of an analysis process which uses discrete event simulation in combination with processor scalability factors.

FIG. 7 is a flow diagram of a first embodiment of analysis process 120 for analyzing the performance of a computer system configuration. In FIG. 7 the analysis process 120 is shown as discrete event simulation process 121 which starts by specifying in a discrete event simulation of a computer system configuration the system parameters 310. System parameters 310 contain at least the description of the operating systems 311; the CPU architectures 312; hardware resources 313 such as disk drives, memory, and network interface cards; network topology 314 which describes how the system is interconnected including software dependencies; applications 315 that will run on the system and be simulated; workload 316 which describes at least the rate at which applications submit CPU requests to the system.

Once the system parameters 310 are specified, the simulation process continues in lookup step 320 by looking up the scalability factors from stored scalability factors 110 using CPU architectures 312 and operating systems 311 specified in system parameters 310. The system scalability factors 322 are stored in memory of the host computer system and available for use during the discrete event simulation to compute dynamic efficiencies and expected times of completion for submitted tasks.

The discrete event simulator 300 now executes in simulation process 324 until it has reached a predetermined simulated time, or some other ending criterion, at which time the simulation process ends 326, storing simulation results 325 which may include at least average response times for CPU requests and average CPU utilizations. The discrete event simulation may also produce "break-out" results such as CPU utilization by specific users, user classes, specific applications or transaction types in addition to larger scale results such as user end-to-end response time including other resource usage.

FIGS. 8A, 8B and 8C together form a pseudocode listing showing an implementation embodiment of a simulated CPU task handler for CPU usage on one server within the discrete event simulation process 324 of FIG. 7, the task handler having the capability to dynamically dispatch and track CPU requests in the presence of multiple chips with multiple cores per chip and multiple threads per core. FIG. 8A shows that the simulated CPU task handler has a number of system server characteristics 330 including the number of processor chips in the system, number of cores per chip, the total number of cores, the number of threads per core, the total number of available threads. The server simulator model has server scalability factors 332, which is a subset of the system scalability factors. There are dynamic variables 333 used by the simulated task handler 334: a task index, ith; number of dispatched tasks, ntasks, in the server system not including queued tasks waiting for dispatch; a vector of CPU times requested for each task; and a vector of deliverable thread capacities for each task.

FIG. 8B shows the pseudocode for the simulated task handler. The simulated task handler continuously services task dispatch events in event handler loop 334 which is started when the discrete event simulator process 324 begins. HandleDispatchEvent( ) procedure 335 is called by event handler loop 334 when a dispatch event occurs. HandleDispatchEvent( ) procedure 335 begins by deciding if the table dispatch event is a new task or a completion of a task. If a new task is to be dispatched the number of tasks in the system is incremented and the requested service demand stored accordingly; this will affect the CPU efficiency according to which threads are being actively used and which thread will be used to service the CPU request so that the estimated completion times of active tasks will have to be recomputed. Note that service demand is requested CPU time, typically in SPECint units that have been converted to CPU-seconds in the pseudo code of FIGS. 8A, 8B and 8C.

If the jth task is completed, then all tasks for ith>j are redispatched to the next lowest dispatch order, ith−1, by adjusting the ServiceDemandRemaining vectors. Then the number of active tasks is decremented by one. If service demands are then recomputed in [ServiceDemandCompleted] since the last allocation event for all remaining tasks by calculating the amount of processor work completed and reducing the ServiceDemandRemaining by that amount for each task. The amount of processor work yet to be done for each task is specified by ServiceDemandRemaining. In either the case of a new task being dispatched or a previous task being completed, new times of completion are recalculated for each task in dispatch process 337. The earliest time of completion will become the next event for this simulated server if no new tasks arrive in the interim.

Dispatch process 337 looks up the chip and core position of each task and computes a delivered thread capacity (DTC) for each task by calling DeliveredThreadCapacity process 338. Furthermore, an expected time of completion for each task (ExpectedTimeOfCompletion) is computed for use by the discrete event simulator engine.

DeliveredThreadCapacity is computed in process 338 according to the previously described method for calculating OS, chip, core and thread efficiencies, the methods using scalability factors 332 to compute scalabilities as indicated explicitly in FIG. 8C as set of methods 339.

Set of methods 336 specifically give the number of elements utilized according to dispatch order rules.

The dispatch order implicitly following the dispatch order rules of (1) selecting the first available chip with the fewest number of active threads servicing tasks; (2) selecting the first available core on that chip with the fewest number of active threads servicing tasks; (3) selecting an idle thread on the selected core and selected chip.

DeliveredThreadCapacity 338 computes and returns the system_scalability as in Table 1 for the active thread on ichip and icore, for nthreads active threads in the system.

In FIG. 8C, steps 336 show the computational procedures for the number of contending elements from threads, cores and chips according to the dispatch order. The number of contending elements in each case becomes the corresponding N[i] of Table 1.

Steps 339 then implement the EffectiveNElements[i] calculations of Table 1 for OS, chips, cores and threads, respectively for OS. OS_EffectiveNElements, Chip_EffectiveNElements, Core_EffectiveNElements; and Thread_EffectiveNElements.

The dispatch order rules given and utilized in connection with the methods of FIGS. 8A, 8B and 8C are not the only method to dispatch tasks to a multithreaded, multicore set of processor chips; however, the dispatch order rules that cause CPU requests to be as evenly distributed as possible across the processor chips and cores will typically maximize efficiency. In actual systems, dispatch order may follow different rules. For example, some operating systems use rules based on processor affinity wherein tasks may not be redispatched to a different chip or in some cases to a different core when other tasks arrive or complete. In a discrete event simulator, OS system alternative dispatch order rules may be followed, for example, by using linked lists to track the position of a task within the thread hierarchy. The fundamental formulas are applied the same way as in the EffectiveNElements calculated in set of methods 339, however, the number of elements utilized, as calculated in set of methods 336, for the given dispatch order rules must be computed in a manner consistent with the alternative dispatch order rules. Similarly, Dispatch process 337 would follow the alternative dispatch order rules. The present inventive concepts are not limited to a specific method of dispatch.

Figure 9:
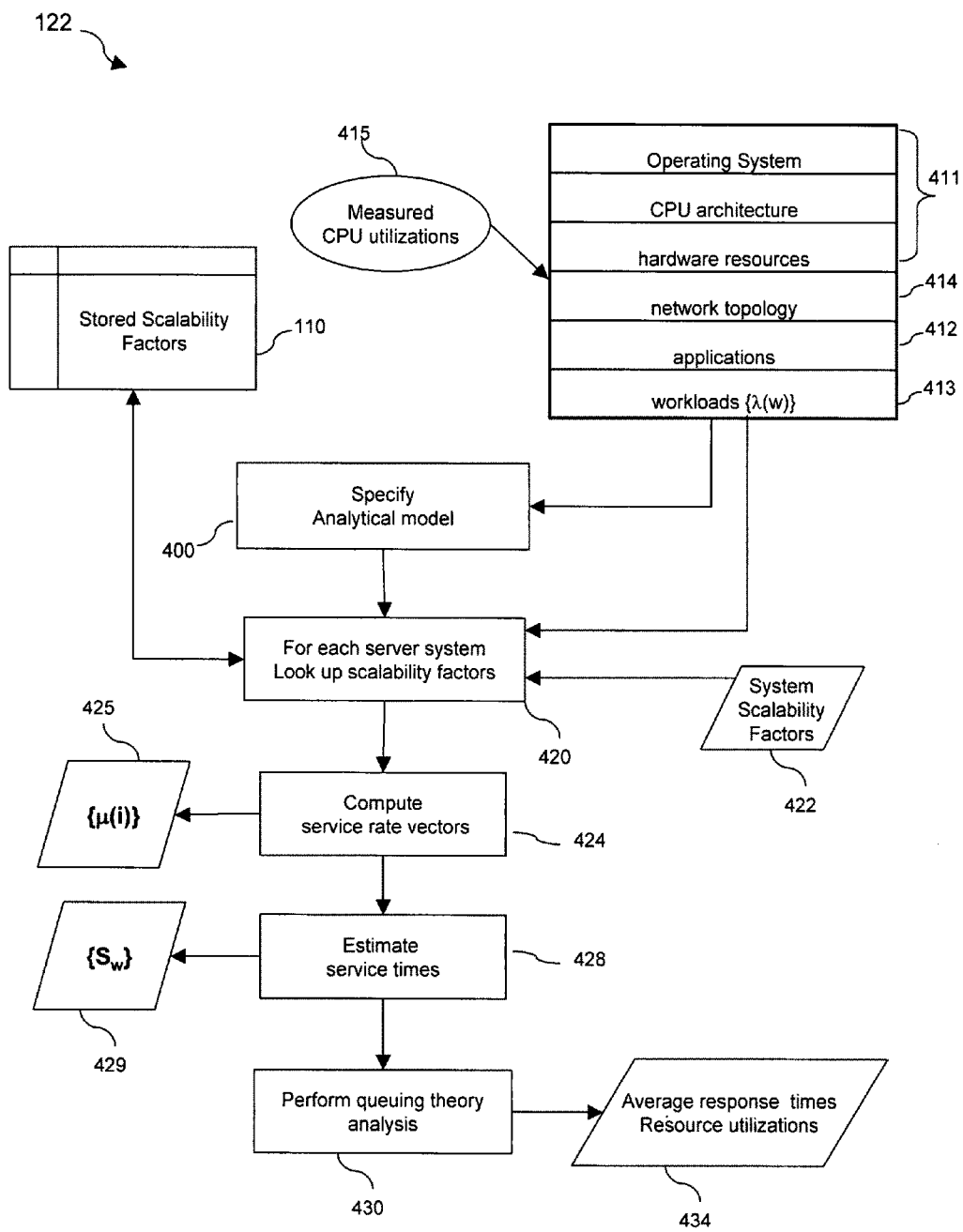
FIG. 9 is a flowchart depicting another preferred embodiment of an analysis process which uses standard queuing theory analysis in combination with processor scalability factors.

FIG. 9 is a flow diagram of a first embodiment of analysis process 120 for analyzing the performance of a computer system configuration. In FIG. 9 the analysis process 120 is shown as analytic modeling process 122 which starts by specifying 400 in an analytic model of a computer system configuration the system parameters 410. System parameters 410 contain at least the description of the operating systems, the CPU architectures and hardware resources 411 such as disk drives, memory, and network interface cards; network topology 414 which describes how the system is interconnected including software dependencies; applications 412 that will run on the system and be simulated; workloads {w} 413 including at least the rates $\lambda_w$ per workload w at which applications submit CPU requests to the system and measured CPU utilizations {U(w)} for workloads {w}.

Once the system parameters 410 are specified, the analytic process continues in step 420 by looking up the scalability factors from stored scalability factors 110 using CPU architectures 412 and operating systems 411 specified in system parameters 410. The system scalability factors 422 are stored in memory of the host machine and are available for use in analytic calculations to compute service rate vectors {μ(i)} and estimated service times {$S_w$} per workload w and which in turn are submitted to standard queuing theory analysis 430. The service rate vectors {μ(i)} are computed in service rate calculation 424 and stored as service rate vectors 425. The service times {$S_w$} are computed in estimate service time process 428 and stored as service times 429.

Standard queuing theory analysis 430 yields information 434 about the system with system configuration 410, the information 434 including at least the average response time per workload w and the estimated average CPU utilization <U(w)> per workload w or per set of workloads {w} submitted at submission rates, {λ(w)}.

FIG. 10 show a pseudo code listing for service rate vector calculation 424. This calculation is performed for each processor configuration in the system. A set of parameters 450 derived from system configuration parameters 410 and system scalability factors 422 are required to perform service rate vector calculation 424 for a given server. The service rate vectors are computed for each server in the system specified in system configuration parameters 410 for a complete capacity planning analysis.

Set of parameters 450 includes the number of processor chips in the given server, number of cores per chip in the given server, the total number of cores in the given server, the number of threads per core in the given server, and the maximum number of usable threads on the given server. The analytical model has server scalability factors 451, which is a subset of the system scalability factors 422. Additionally, there are variables utilized in the pseudo code listing: i, which is an index for counting the number of tasks dispatched to threads on the given server, ichip is a chip index selecting one of the chips on the given server, icore is a core index selecting one of the cores on the selected chip.

The primary step of computing μ(i) 454 essentially sums the delivered capacity of each active thread when i threads are dispatched to the server system. The delivered capacity is computed in procedure 455 for a given core, icore, and a given chip, ichip, wherein the OS EffectiveNElements, chip EffectiveNElements, core EffectiveNElements and thread EffectiveNElements are computed according to steps 339 in conjunction with corresponding numbers of contending elements computed in step 336 of FIG. 8C.

The dispatch order rules given and utilized in connection with the methods of FIGS. 8A, 8B and 8C are utilized implicitly in connection with the ServiceRateCalcuation 424 of FIG. 10. Alternative embodiments are envisioned wherein alternative dispatch order rules are followed and the ServiceRateCalcuation 424 adjusted accordingly, the present inventive concepts not being limited to a specific method of dispatch.

FIG. 11 is a pseudo code listing of estimate service times process 428. This estimation process is performed for each processor configuration in the system. A set of parameters 440 are required to perform process 428 and to describe the elements therein. The set of parameters 440 include service rate vectors μ(i) as calculated in service rate calculation 424 for i active threads in the given system, the maximum number of threads in the system, measured utilization per workload, measured utilization summed over all workloads, arrival rate of workloads, the maximum number of iterations to perform in the estimation process, and the required tolerance for converging the process. The required tolerance is typically between 0.1% and 1% difference between measured and computed utilizations. Process 428 operates to find the set of service times {$S_w$} for each workload w consistent with measured utilizations {$U_w$} and arrival rates {$\lambda_w$} that correctly predict the total CPU utilization when all workloads are running.

Maximum and minimum efficiencies are computed in step 442, the maximum efficiency being 1 (one) by definition and the minimum efficiency being the minimum of μ(i)/i of all possible threads i in the system. The initial service time estimates {$S_w$} are derived in step 444 wherein the efficiency E is effectively an adjustment parameter that will be iteratively adjusted to some value between E_min and E_max as given in step 442. Iteration step 446 repeats the process of adjusting service times {$S_w$} and predicting an overall traffic intensity ρ and utilization U from the adjusted service times {$S_w$}, until one of the following is true: (|U−$U_0$|<U_tolerance), or the maximum number of iterations is exceeded. Service times {$S_w$} are adjusted within iteration step 446 according to the adjustment step 448.

The present invention includes a system for creating a set of scalability models encapsulated in scalability modeling process 108 of FIG. 4, and for which a detailed description now follows. According to FIG. 4 a set of performance data has been assembled into internal repository 102. A table describing the set of records 130 in internal repository 102 is given in FIG. 5.

Figure 12:
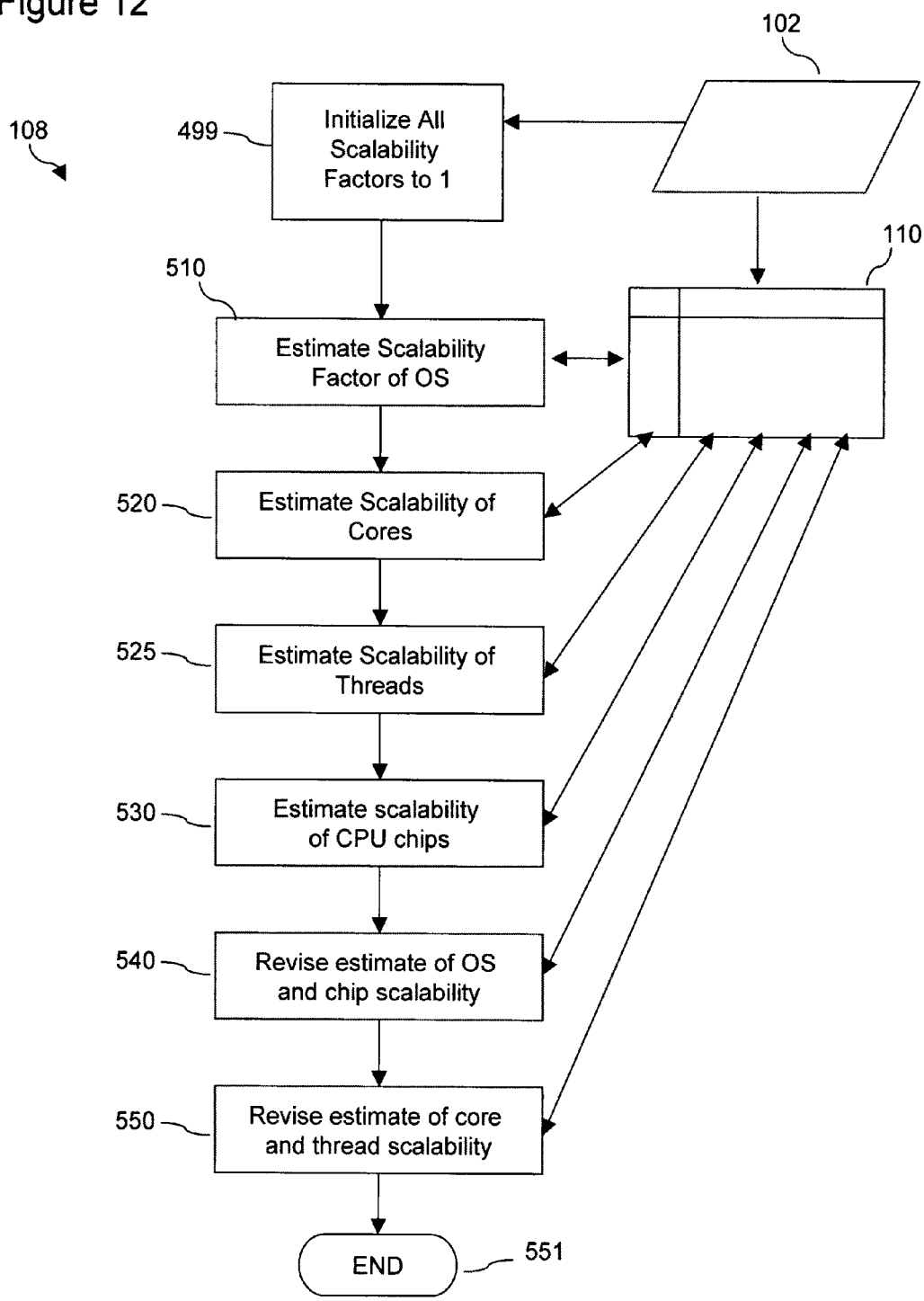
FIG. 12 is a flowchart depicting a preferred embodiment of the process for creating scalability factors from existing CPU performance data in the preferred embodiment of the present invention.

Turning to FIG. 12, with reference to FIG. 4 and Table 1, a description of scalability modeling process 108 is shown. In step 499, all scalability parameters are set to 1 as an initial estimate. In step 510, the scalability parameters {(L[1], α[1])} for a set of operating systems are estimated from the data in internal repository 102 and stored in scalability factors 110. At step 520, a set of core scalability parameters {(L[3], α[3])} are estimated for a set of processor chip types and stored in scalability factors 110. At step 525, a set of thread scalability factors {(L[4], α[4])} are estimated. In step 530, the scalability parameters {(L[2], α[2])} for a set of system architectures is estimated and stored in scalability factors 110. The scalability parameter estimates having been propagated throughout the data sets of interest are then revised steps. All data is stored in memory of the host machine.

In step 540 the set of OS scalability parameters are adjusted for each operating system and then the set of chip scalability parameters is adjusted for system configurations and system architectures. In step 550, the set of core scalability parameters and the set of thread scalability parameters are adjusted. The process terminates at step 551.

In the preferred embodiment of the present invention, the scalability modeling process 108 is performed periodically on the internal repository 102 as internal repository 102 is periodically refreshed with data from new systems that has been gathered from the internet or other sources.

Figure 13:
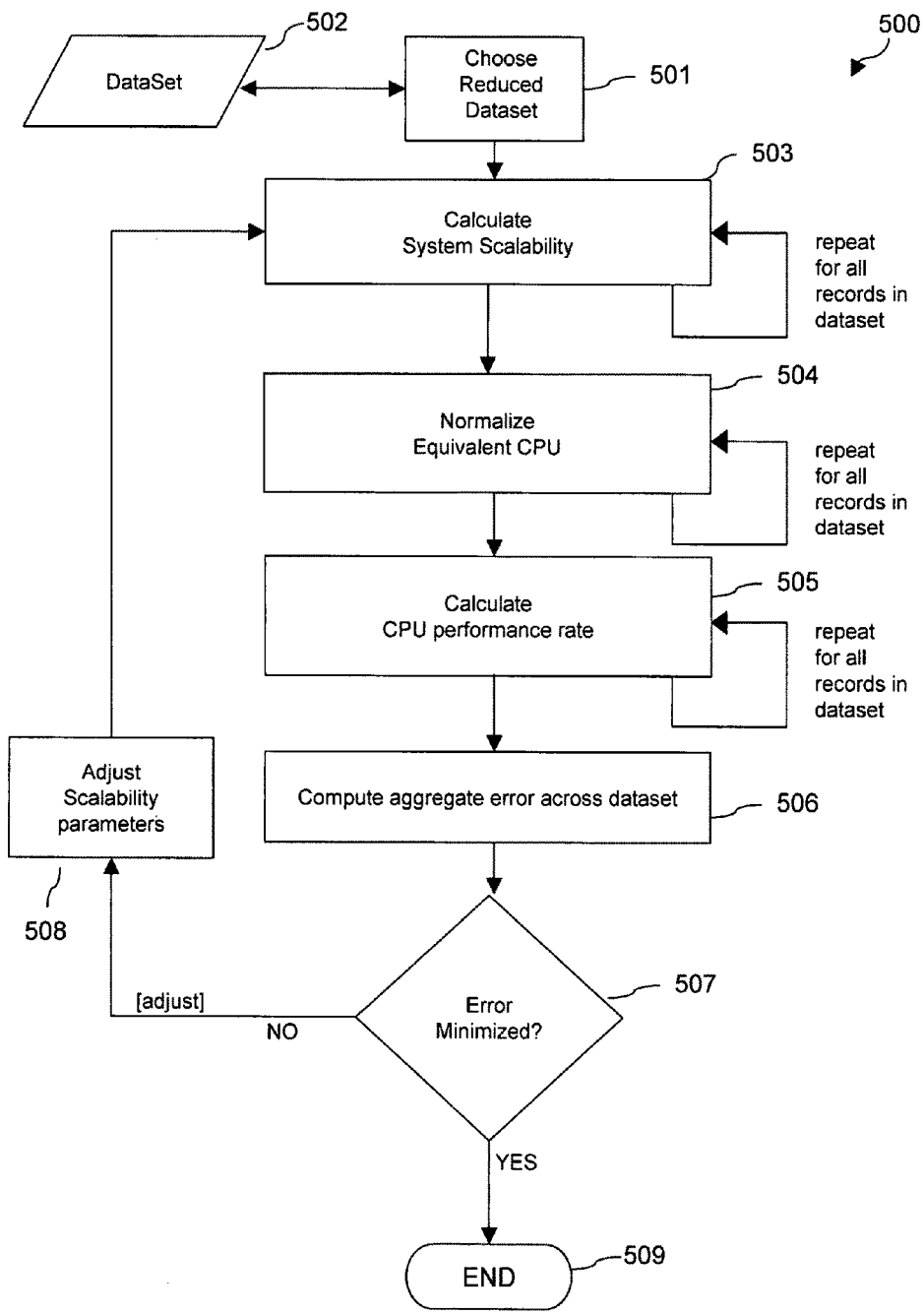
FIG. 13 is a flowchart depicting a preferred embodiment of the fit process for determining scalability factors from existing CPU performance data in the preferred embodiment of the present invention.

Detailed descriptions of estimate steps 510, 520 and 530 will now be described in relation to FIG. 13. In the evaluation of scalability factors for adequate fit to the data, several records are grouped into a dataset 502 in which system throughput capacity is calculated and compared to measured throughput data to determine the "goodness" of fit of a scalability factor. Method 500 begins at step 501 in which reduced dataset 502 is chosen from the records in the internal repository 102. Reduced dataset 502 is comprised of groups of records sharing a common feature such as operating system type or processor type. At step 503, the system scalability is calculated according to the formula for "System_Scalability" given in Table 1 where N[2] is taken as the number of processor chips 135, N[3] is taken as the number of cores per chip 136, N[4] is taken as the number of threads per core 137, and $$N[1]=N[2]*N[3]*N[4],$$

is the total number of threads at which the multithread performance 139 is measured.

Step 503 is then repeated for all records in reduced dataset 502.

In step 504, the system_scalability is normalized according to the equation:

$$Equiv\_CPU=System\_Scalability*N[1]$$

Step 504 is repeated for all records in the reduced data set 502.

In step 505, the computed performance rate, R_calc is calculated from the measured single threaded performance 138, S_meas, for the first record in dataset 502 according to $$R\_calc=S\_meas*Equiv\_CPU$$

Step 505 is repeated for all records in dataset 502.
Step 505 is repeated for all records in dataset 502.

In step 506, the least squares error between a measured performance rate R_meas 139 and the computed performance rate R_calc is calculated for each record and summed over all records, r, according to:

$$error = \frac{\sum_r (R\_calc - R\_meas)^2}{(R\_meas)^2},$$

R_meas 139 for each record is obtained from known sources of performance data such as the manufacturer of each system. S_meas is commonly referred to in the art as SPECint data. R_meas is commonly referred to in the art as SPECint_rate data. The error is checked to be minimal in step 507 by comparison against a predetermined standard and if not acceptable, the process continues at step 508. At step 508, calculation of the scalability factor according to process 500 is repeated. If the error is determined to be acceptable, process 500 ends at step 509. Criteria for minimization in the preferred embodiment are error ≦1% or a given number of iterations on the dataset 502, typically 10 or less.

The least squares method to determine the error is the method used in the preferred embodiment. In alternate embodiments of the present invention, other measures of goodness of fit may be used without substantially changing the scalability modeling process.

Figure 14:
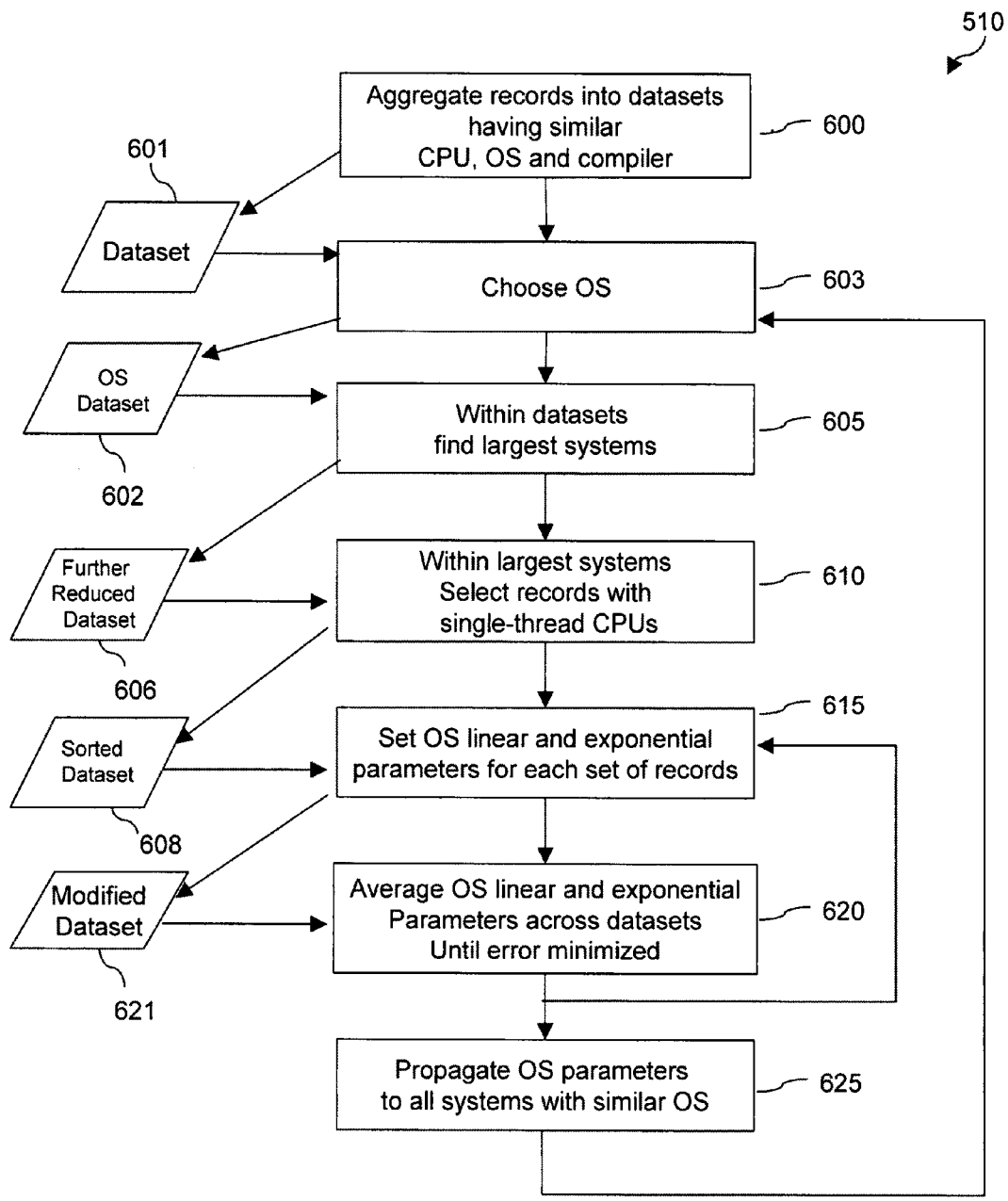
FIG. 14 is a flowchart depicting a preferred embodiment of the detailed process for creating scalability factors for operating systems from existing CPU performance data in the preferred embodiment of the present invention.

FIG. 14 is a flow diagram of substeps that comprise step 510 of FIG. 12. In step 600, records 130 are organized such that records having similar processor chip types, operating systems and compilers are grouped together into a reduced dataset 601. In step 603, a particular operating system type is chosen from the operating systems represented in reduced data set 601 and resulting records from an OS dataset 602. In step 605, the "largest systems" within the chosen OS dataset 602 are sorted into further reduced dataset 606 for evaluation. "Largest system" means systems with the largest number of threads and with at least three different sets of measured performance rates. "Measured performance rates" are parameters such as processor speed and SPEC-int rate that are provided by the manufacturer. Within further reduced dataset 606, records with single threads per core are selected in step 610 and organized into sorted dataset 608. In step 615, the OS scalability parameters for records in sorted dataset 608 are used to estimate the scalability factors of the OS as set out in process 500 of FIG. 13. In step 620, the OS scalability factors are copied to all other records for the OS dataset 602 resulting in modified dataset 621. Steps 615 and 620 are repeated using the modified dataset on each pass until the error is minimized to an acceptable level (as shown in step 507 of FIG. 13). In step 625, the OS scalability factors are copied to all records in the internal repository with that OS. The process 510 is repeated at step 603 for all other operating systems in the internal repository.

Figure 15:
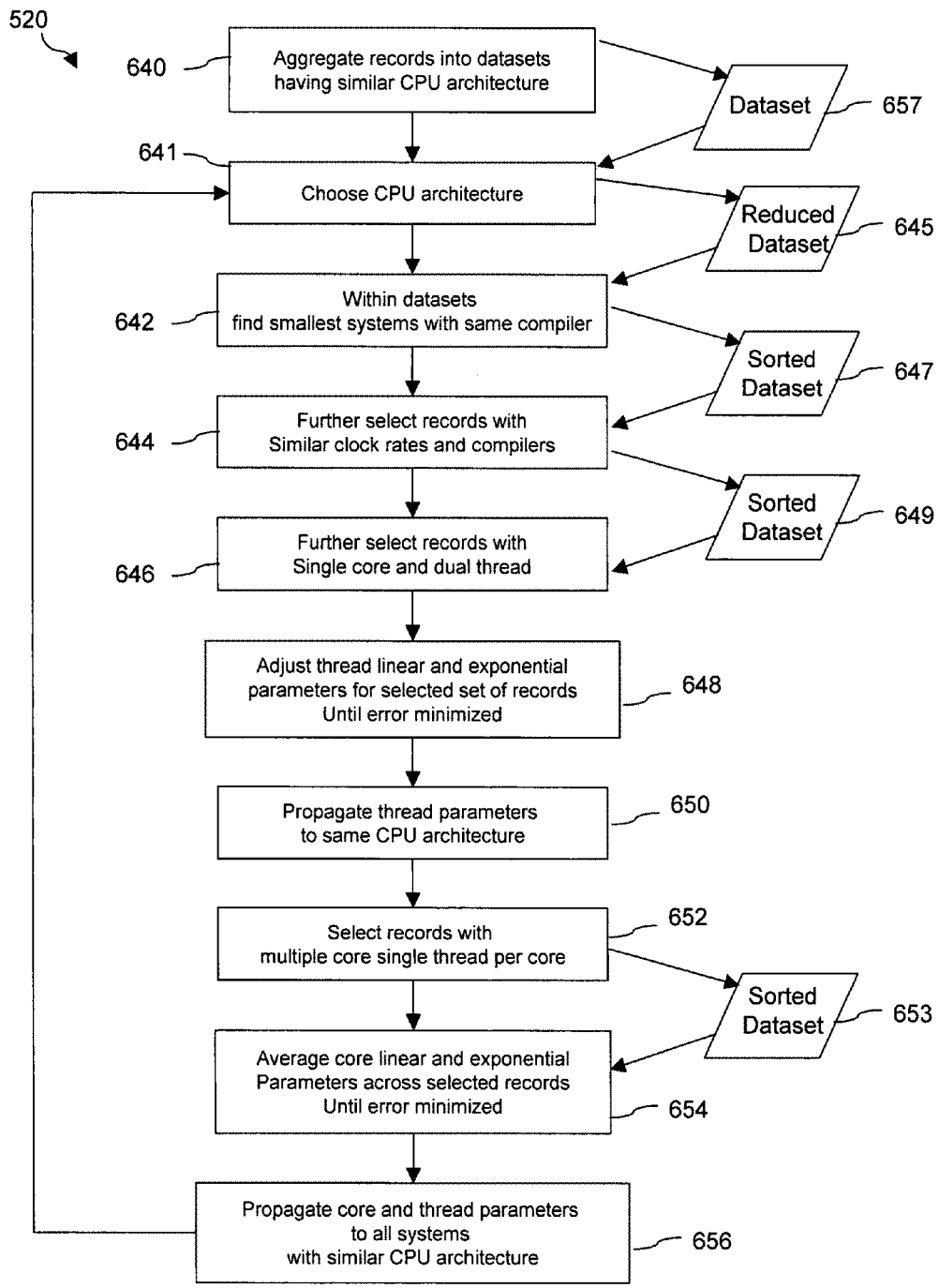
FIG. 15 is a flowchart depicting a preferred embodiment of the detailed process for creating scalability factors for threads and cores from existing CPU performance data in the preferred embodiment of the present invention.

FIG. 15 is a flow diagram of step 520 of FIG. 12. In step 640, records 130 having similar processor chip types are grouped together to form dataset 657. In step 641, a type of processor chip is selected from the groups in the dataset 502 and stored in reduced dataset 645. In step 642, the reduced dataset is further sorted for the "smallest systems" with the same compiler into sorted dataset 647. The "smallest systems" are defined as those with the smallest number of active cores. "Active cores" are those cores having a task running on a thread. In step 644, the sorted records are further grouped by similar processor chip clock rate and compiler into sorted dataset 649. In step 646, specific records from the clock rate grouped records are chosen having single core 2-thread processors. In step 648, thread scalability factors are estimated as shown in process 500. At step 650, the thread scalability factors are copied to all records within reduced dataset 645. In step 652, records from reduced dataset 645 resulting from step 650 are selected if they have multiple cores and a single thread per core and are stored in sorted dataset 653. In step 654, core scalability factors are then estimated as shown in process 500 using the specific record with single core 2-thread processors. Finally, in step 656, the core and thread scalability factors are copied to all records in the dataset 502. Process 520 is repeated for all other processor chip types in the internal repository.

Figure 16:
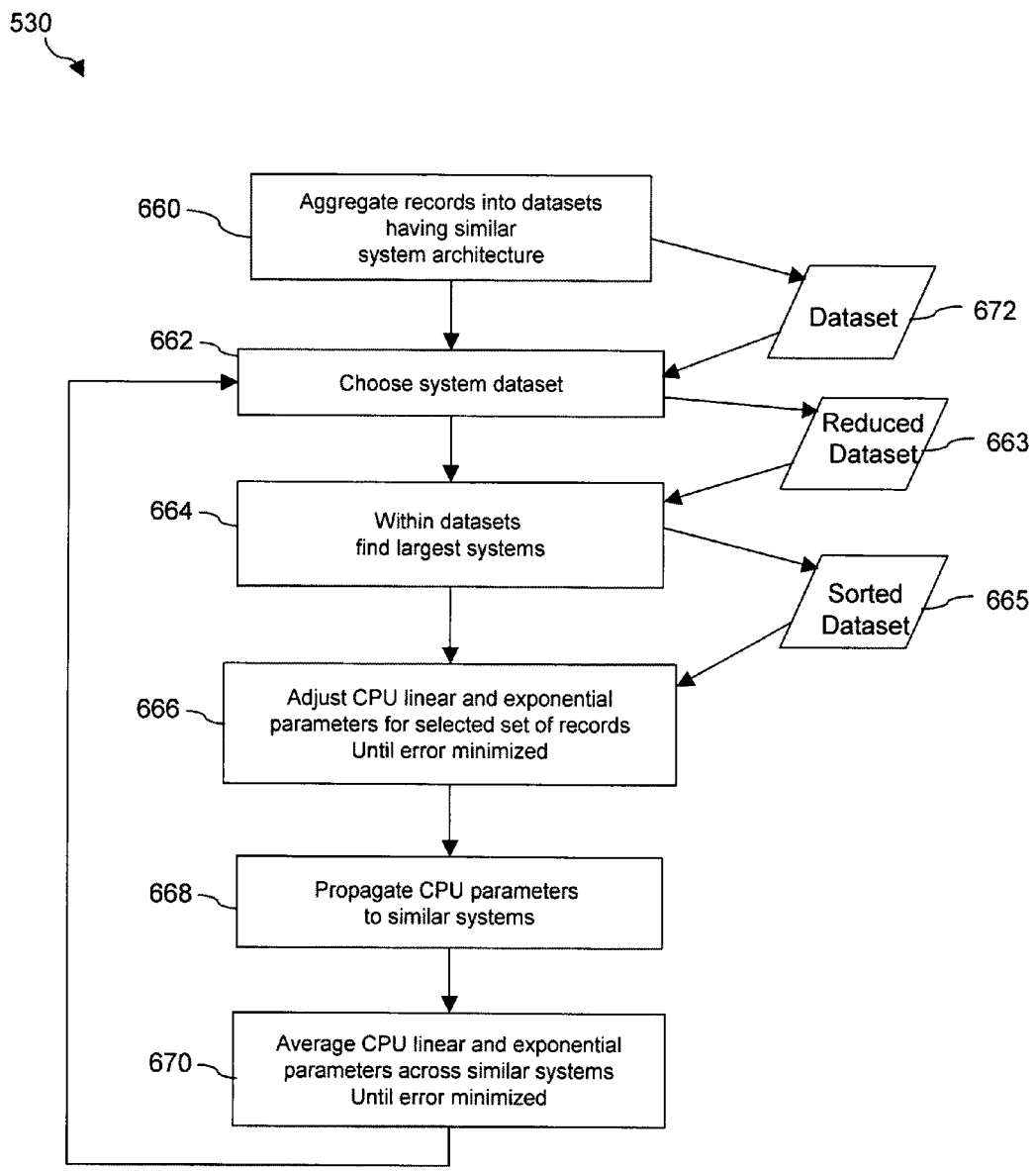
FIG. 16 is a flowchart depicting a preferred embodiment of the detailed process for creating scalability factors for CPU chips from existing CPU performance data in the preferred embodiment of the present invention.

FIG. 16 is a flow diagram of step 530 of FIG. 12. In step 660, records 130 having similar system architectures are grouped in dataset 672. In step 662, a given system dataset for a particular system architecture is chosen to operate upon as reduced dataset 663. In step 664, the systems with the "largest number" of processor chips within the particular system architecture are sorted into a sorted dataset 665. In step 666, the chip scalability factors are estimated as shown in process 500. In step 668, the chip scalability factors are copied to all other records in reduced dataset 663. In step 670, chip scalability factors are estimated as shown in process 500 for sorted dataset 665 as modified by step 668. The process 530 is repeated beginning at step 662 for all other system architectures in the internal repository 102.

The invention claimed is:

1. A method of calculating a system scalability factor of a computer processor system including a processor, the processor having a core, the core capable of running a thread, the thread capable of supporting a task and the processor running an operating system; the method comprising:
   estimating an initial value of an operating system scalability factor;
   estimating a thread scalability factor;
   estimating a CPU scalability factor;
   estimating a processor core scalability factor;
   iteratively combining the initial value of the operating system scalability factor, the thread scalability factor, the CPU scalability factor and the processor core scalability factor in an equation having a set of linear elements and a set of exponential elements to arrive at a result;
   the step of iteratively combining further comprising the steps of:
   a. grouping a set of measured performance records into a dataset;
   b. computing a set of scalable processing quantities for the dataset;
      the step of computing further comprising the steps of:
      i. counting a number of active threads servicing CPU requests as a first number of active elements, N[1];
      ii. counting a number of CPUs having active threads as a second number of active elements, N[2];
      iii. counting a number of cores per CPU having active threads as a third number of active elements, N[3]; and,
      iv. counting a number of active threads per core as a fourth number of active elements, N[4];
   c. normalizing the set of scalable processing quantities by a corresponding number of active elements to produce a set of normalized scalabilities; and
   d. determining the result as a product of the normalized scalabilities; combining the result with a measured performance parameter to arrive at an error; comparing the error to a predetermined maximum error;
   repeating the step of iteratively combining if the error is greater than the predetermined maximum error;
   accepting the result as the system scalability factor of the computer processor system.

2. The method of claim 1 including the additional step of setting the operating system scalability factor, the thread scalability factor, the CPU scalability factor and the processor core scalability factor to a value of one as a default estimate.

3. The method of claim 1 wherein the step of computing a set of scalable processing quantities further comprises the additional steps of:
   associating a first linear scalability factor L[1] and a first exponential scalability factor a[1] to the operating system scalability factor;
   associating a second linear scalability factor L[2] and a second exponential scalability factor a[2] to the CPU scalability factor;
   associating a third linear scalability factor L[3] and a third exponential scalability factor a[3] to the processor core scalability factor;
   associating a fourth linear scalability factor L[4] and a first exponential scalability factor a[4] to the thread scalability factor;
   computing the set of scalable processing quantities SP[i] for i in the range 1 to 4 according to the equation:

$$SP[i]=(1+L[i]\times(N[i]-1))\times a[i]^{(N[i]-1)}.$$

4. The method of claim 3 wherein the step of normalizing the set of scalable processing quantities by a corresponding number of active elements to produce a set of normalized scalabilities comprises the additional step of:
   computing the normalized scalabilities S[i] for i in the range 1 to 4 according to the equation:

$$S[i]=SP[i]/N[i].$$

5. The method of claim 4 wherein determining the result as a product of the normalized scalabilities is calculated as a system scalability, SS[i], for i in the range 1 to 4 according to the equation:

$$SS[i]=\Pi s[i].$$

6. The method of claim 1 wherein the step of computing a set of scalable processing quantities comprises the additional steps of:
   associating a total number of active threads to a first number of active elements, N[1];
   counting a number of CPUs having active threads as a second number of active elements, N[2];
   counting a number of cores per CPU having active threads as a third number of active elements, N[3];
   counting a number of active threads per core as a fourth number of active elements, N[4];
   setting the total number of active threads equal to:

$$N[1]=N[2]\times N[3]\times N[4].$$

7. The method of claim 6 including the additional step of computing an equivalent CPU scalability factor, EquivCPU, from the result of an estimated system scalability, ESS, as:

$$EquivCPU=ESS/N[1].$$

8. The method of claim 7 wherein the step of combining the result with a measured performance parameter to arrive at an error includes the additional steps of:

calculating a throughput rate, R_calc, from a measured single thread performance, S_meas taken from the set of measured performance records, according to the formula:

$$R\_calc = S\_meas \times EquivCPU;$$

computing the error using R_calc and a set of measured throughput rates R_meas from the set of measured performance records, according to the formula:

$$error = \frac{\sum (R\_calc - R\_meas)^2}{(R\_meas)^2}; and,$$

wherein the summation is performed over the set of measured throughput rates.

9. The method of claim 8 including the further step of deriving the measured single thread performance from SPECint data gathered from a web site.

10. The method of claim 8 including the further step of deriving the measured throughput rate from SPECint_rate data gathered from a web site.

11. The method of claim 1 wherein the step of iteratively combining the initial value of the operating system scalability factor, the thread scalability factor, the CPU scalability factor and the processor core scalability factor includes the additional step of adjusting the set of linear elements and the set of exponential elements.

12. The method of claim 3 including the iterative steps subsequent to the step of computing a set of scalable processing quantities of:

adjusting at least one of the group of L[1], L[2], L[3], L[4], a[1], a[2], a[3] and a[4];

recomputing the set of scalable processing quantities SP[i].

* * * * *

UNITED STATES PATENT AND TRADEMARK OFFICE
CERTIFICATE OF CORRECTION

| | | |
|---|---|---|
| PATENT NO. | : 7,957,948 B2 | Page 1 of 1 |
| APPLICATION NO. | : 11/895176 | |
| DATED | : June 7, 2011 | |
| INVENTOR(S) | : Kenneth C. Zink et al. | |

It is certified that error appears in the above-identified patent and that said Letters Patent is hereby corrected as shown below:

Title Page, Item (73)
The Assignee name printed on the patent is misspelled.
Please replace "Hyperformit, Inc." with "Hyperformix, Inc."

Signed and Sealed this
Sixteenth Day of August, 2011

David J. Kappos
*Director of the United States Patent and Trademark Office*